(12) United States Patent
Paul

(10) Patent No.: US 10,917,979 B1
(45) Date of Patent: Feb. 9, 2021

(54) CONTROL BOX

(71) Applicant: Hunter Industries, Inc., San Marcos, CA (US)

(72) Inventor: Michael F. Paul, San Diego, CA (US)

(73) Assignee: Hunter Industries, Inc., San Marcos, CA (US)

( * ) Notice: Subject to any disclaimer, the term of this patent is extended or adjusted under 35 U.S.C. 154(b) by 0 days.

(21) Appl. No.: 16/568,113

(22) Filed: Sep. 11, 2019

(51) Int. Cl.
| | |
|---|---|
| H05K 5/00 | (2006.01) |
| H05K 5/03 | (2006.01) |
| H01R 13/447 | (2006.01) |
| H05K 5/02 | (2006.01) |
| A01G 25/16 | (2006.01) |
| F21W 131/10 | (2006.01) |
| F21V 23/00 | (2015.01) |

(52) U.S. Cl.
CPC ........... *H05K 5/0017* (2013.01); *A01G 25/16* (2013.01); *H01R 13/447* (2013.01); *H05K 5/0047* (2013.01); *H05K 5/0217* (2013.01); *H05K 5/03* (2013.01); *F21V 23/008* (2013.01); *F21W 2131/10* (2013.01); *H05K 5/0256* (2013.01)

(58) Field of Classification Search
CPC ...... H05K 5/0017; H05K 5/03; H05K 5/0047; H05K 5/0217; H05K 5/0256; H01R 13/447; A01G 25/16; F21W 2131/10; F21V 23/008
See application file for complete search history.

(56) References Cited

U.S. PATENT DOCUMENTS

| | | | | |
|---|---|---|---|---|
| 3,410,247 A | * | 11/1968 | Dronberger | G05G 1/10 116/311 |
| 4,920,823 A | * | 5/1990 | Mohr | G05G 1/10 16/441 |
| 6,112,619 A | * | 9/2000 | Campbell | F16K 31/60 116/277 |
| 6,242,064 B1 | * | 6/2001 | Howie, Jr. | A44B 1/06 150/155 |

(Continued)

OTHER PUBLICATIONS

[Fallenpumpkins], "Hunter X-CORE retic controller tear down faulty dial". Feb. 4, 2017. https://www.youtube.com/watch?v=Hj_u679t7eM (Year: 2017).*

(Continued)

*Primary Examiner* — Abhishek M Rathod
(74) *Attorney, Agent, or Firm* — Knobbe, Martens, Olson & Bear LLP

(57) ABSTRACT

A landscape control box includes a base portion and a facepack. The facepack supports a rotary shaft extending along an axis in a first direction. A cover has a hole aligned with the rotary shaft. A knob has a receptacle and a first portion of an interacting structure. The receptacle engages with the rotary shaft so as to transfer rotational motion of the knob to the rotary shaft. The first portion of the interacting structure engages with a second portion of the interacting structure on the cover so as to inhibit movement of the knob. The control box can receive one or more modules for enhancing functionality of the control box and/or superseding station programming stored by the control box or input by the user. The control box includes openings that are sized and shaped to allow attachment of different sized pipes and conduits to the control box.

20 Claims, 18 Drawing Sheets

(56) References Cited

U.S. PATENT DOCUMENTS

| | | | | |
|---|---|---|---|---|
| 7,953,517 | B1* | 5/2011 | Porter | A01G 25/165 |
| | | | | 700/284 |
| 8,977,400 | B1* | 3/2015 | Porter | A01G 25/165 |
| | | | | 239/69 |
| 9,678,485 | B2* | 6/2017 | Malaugh | G05B 13/02 |
| 2006/0030971 | A1* | 2/2006 | Nelson | A01G 25/165 |
| | | | | 700/284 |
| 2007/0208462 | A1* | 9/2007 | Kah | A01G 25/165 |
| | | | | 700/284 |
| 2008/0027587 | A1* | 1/2008 | Nickerson | G05D 7/0676 |
| | | | | 700/284 |
| 2009/0045038 | A1* | 2/2009 | Worones | G01R 15/002 |
| | | | | 200/11 DA |
| 2009/0256364 | A1* | 10/2009 | Gadau | G06F 1/1656 |
| | | | | 292/128 |
| 2013/0145894 | A1* | 6/2013 | Park | D06F 34/28 |
| | | | | 74/504 |

OTHER PUBLICATIONS

Man, R., & Reticcontrollerman. (Jul. 19, 2017). Irrigation Controller Supply and Installation in Joondalup. Retrieved Jun. 25, 2020, from http://reticcontrollerman.com/tag/control-boxes/page/2/ (Year: 2017).*

* cited by examiner

CONTROL BOX

TECHNICAL FIELD

This application relates to control boxes. Applications for use of the control box include as an irrigation control box, a lighting control box, or other landscape control box.

DISCUSSION OF THE RELATED ART

Landscape control boxes used for irrigation can control sprinklers, valves, and other irrigation devices in an irrigation system. Landscape control boxes used for lighting can control spot lights, path lights, switches, and other lighting devices in a lighting system.

Depending on the intended use, the boxes can include many components such as a facepack, a microcontroller, various operator inputs devices such as knobs, switches and buttons, a display, output terminals to connect to irrigation valves or relays, light switches to connect to lights, input terminals to connect to external sensors such as moisture, rainfall, time, or ambient light, and electronic circuitry to connect each of the components to their appropriate other component(s).

SUMMARY

An aspect is directed to a landscape control box that comprises a base portion having a plurality of side walls and a back wall forming an interior, and a facepack supported by the base portion. The facepack comprises a printed circuit board supporting a rotary shaft extending along an axis in a first direction, a cover supporting the printed circuit board so that the printed circuit board is disposed between the cover and the base portion at least when the facepack is supported by the base portion, the cover having a hole aligned with the rotary shaft, and a knob disposed at least partially in the hole and having a receptacle and one or more posts, the receptacle engaging with the rotary shaft so as to transfer rotational motion of the knob to the rotary shaft, the one or more posts engaging with the cover so as to inhibit movement of the knob along the axis in the first direction.

Another aspect is directed to a landscape control box that comprises a base portion having a plurality of side walls and a back wall forming an interior and a facepack supported by the base portion. The facepack comprises a component supporting a rotary shaft extending along an axis in a first direction, a cover supporting the component so that the component is disposed between the cover and the base portion at least when the facepack is supported by the base portion, the cover having an interacting structure, and a knob disposed on the cover and having a receptacle and an interacting structure, the receptacle being configured to operably couple to the rotary shaft, the interacting structure of the knob engaging with the interacting structure of the cover so as to inhibit movement of the knob along the axis in the first direction.

Another aspect is directed to a landscape control box that comprises a base portion having a plurality of side walls and a back wall forming an interior and a facepack supported by the base portion. The facepack comprises a rotary shaft extending along an axis in a first direction, a cover supporting the rotary shaft so that at least a portion of the rotary shaft is disposed between the cover and the base portion at least when the facepack is supported by the base portion, the cover having a first interacting structure, and a knob disposed on the cover and having a hub and a second interacting structure, the hub being configured to operably couple to the rotary shaft, the first interacting structure engaging with the second interacting structure so as to inhibit movement of the knob along the axis in the first direction.

Another aspect is directed to an irrigation system comprising a control box; a facepack supported by the control box and configured to enable a user to enter and/or select a first watering schedule, the facepack comprising a first memory configured to store an operational program that implements the first watering schedule and a first processor configured to execute the first operational program by having stations turned off or on; and at least one module engageable with the facepack, the at least one module comprising a second memory configured to store a second operational program that implements a second watering schedule and a second processor configured to send instructions to the first processor to execute the second operational program, wherein the first processor is configured to execute the second operational program based on the instructions received from the second processor.

A variation of the aspect above is, wherein the instructions supersede, override, or replace the first operational program.

Another variation of the aspect above is, wherein the module comprises a wireless communication module configured to receive the second watering schedule.

Another aspect is directed to a method to turn on and off stations in an irrigation site, the method comprising accepting inputs on a facepack from a user that enable the user to enter and/or select a first watering schedule; storing the first watering schedule in a first memory that is operatively connected to a first processor configured to execute the first watering schedule; receiving a second watering schedule from a module removably engaged with the facepack; and executing the second watering schedule by the first processor to turn on and off stations in the irrigation site.

A variation of the aspect above further comprises superseding, overriding, or replacing the first watering schedule with the second watering schedule.

Another variation of the aspect above further comprises wirelessly receiving the second watering schedule at the module.

BRIEF DESCRIPTION OF THE DRAWINGS

The present inventions are described with reference to the accompanying drawings, in which like reference characters reference like elements, and wherein.

DETAILED DESCRIPTION

Landscape systems often include control boxes having facepacks or other user interface portions which allow a user of the landscape system to set various controls. The control boxes are often mounted on walls, posts, in sheds, in electrical boxes, or in other fixed positions. Control boxes are often placed outside and thus experience significant swings in ambient temperature. Such swings or thermal cycling can, for example, expand or contract components within the control box adversely impacting durability of the components. It is desirable to provide control boxes and facepacks that have controls that are intuitive to the user and have improved durability in adverse weather conditions.

Figure 1:
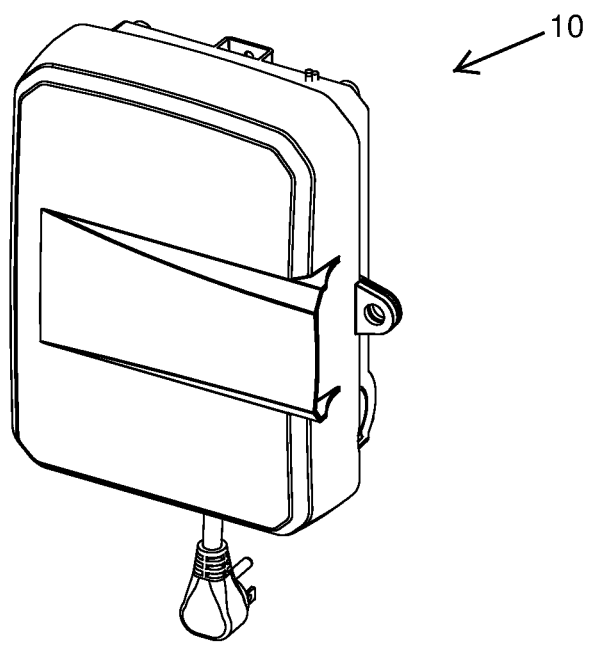
FIG. 1 is a front perspective view of a control box with an outer cover in a closed position secured to a base portion according to a preferred embodiment of the present invention.

FIG. 1 is a front perspective view of a control box 10 with an outer cover 14 in a closed position secured to a base portion 12 according to a preferred embodiment of the present invention. The control box 10 can be employed to control different sets of features in a landscape system including sets of features related to irrigation, lighting, and/or other aspects of landscape systems. In an embodiment, the control box 10 comprises an irrigation controller configured to control irrigation valves. In another embodiment, the control box 10 comprises a lighting controller configured to control lighting fixtures. In a further embodiment, the control box 10 comprises a landscape controller configured to control sprinkler valves and lighting fixtures.

Figure 2:
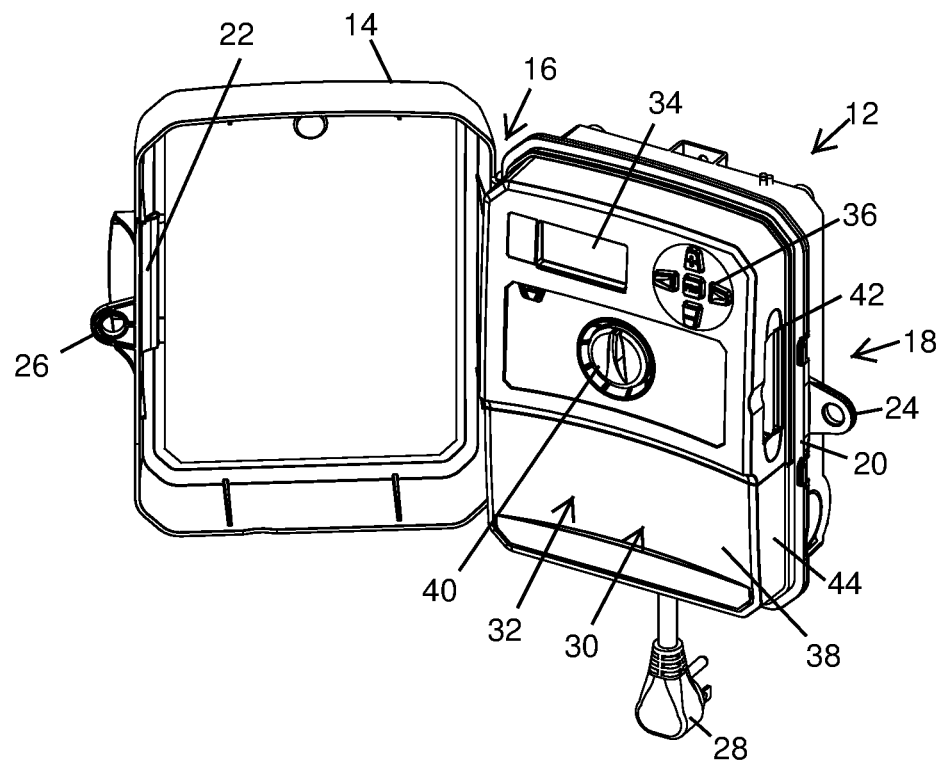
FIG. 2 is similar to FIG. 1 except the outer cover is in an open position revealing a facepack within the control box. A slot is shown in a side of the facepack for receiving one or more modules.

FIG. 2 is similar to FIG. 1 except the outer cover 14 is in an opened position revealing an inner cover or facepack 30 within the control box 10. In certain embodiments, the control box 10 provides the user intuitive controls having improved durability in adverse weather conditions. In certain embodiments, the control box 10 is further configured for the user to easily install or remove one or more modules 128.

In certain embodiments, the facepack 30 can have a back portion. In such an embodiment that includes the back portion, the user can disengage or remove the facepack 30 from a base portion 12 of the control box 10. The user can then reengage or couple the facepack 30 to the base portion 12.

In certain embodiments that have the back portion, one or more of the features described as being a component of the facepack 30 can instead be a component of the base portion 12. For example, outputs, such as one or more terminals 68 can be mounted to the interior of the base portion 12 and not to the facepack 30. In such an embodiment for example, the facepack 30 may still comprise the printed circuit board 86, at least one housing, and/or one or more buttons 36, knobs 40, switches, or other user input structures.

As illustrated, the control box 10 can include the base portion 12. The outer cover 14 can be connected to the base portion 12. As illustrated, the outer cover 14 can be connected to the base portion 12 via a hinge 16. The outer cover 14 can be configured to rotate about the hinge 16 between the closed position (FIG. 1) and the opened position (FIG. 2). In the closed position, the outer cover 14 can engage at a latch 18 on the base portion 12. The latch 18 can include an aperture 20, protrusion, indentation, ridge, detent, or other structure configured to releasably couple with a portion of the outer cover 14. In certain embodiments, the outer cover 14 includes a recess 22 configured to releasably couple to the aperture 20 of the latch 18. In certain embodiments, the control box 10 does not include the outer cover 14. In such embodiments, the facepack 30 itself provides protection from the weather or it is configured to be positioned indoors, or in a place protected from the weather.

Figure 4:
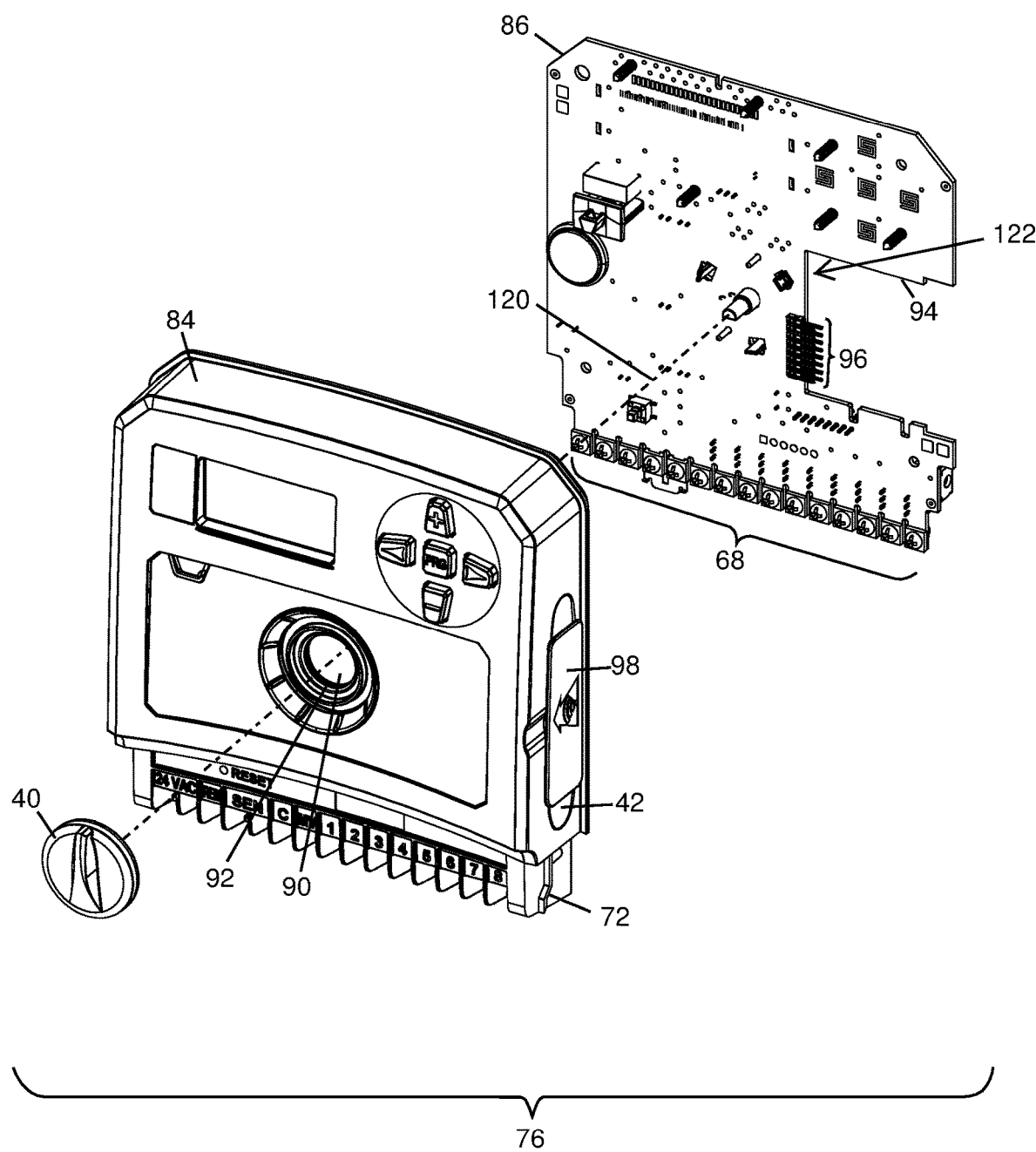
FIG. 4 is an exploded view of the housing from FIG. 3 showing a printed circuit board and a knob disassembled from a back side and a front side of a cover of the housing, respectively. A rotary shaft extends from the printed circuit board towards a hole in the cover and is positioned to allow the knob to engage the rotary shaft along an axis when the printed circuit board is secured to the back side of the cover. Interacting structure mounts the knob to the cover to inhibit the knob from disengaging from the rotary shaft.

In some embodiments, the base portion 12 and the outer cover 14 each include a loop 24, 26 (FIG. 4). The loop 24, 26 can receive, for example, a padlock. The padlock provides the user the ability to limit third party access to the facepack 30 and its settings. In other embodiments, the base portion 12 and the outer cover 14 include a lock (not shown). The lock can be, for example, a rotating or translating lock supported by the outer cover 14 and configured to selectively interface with the base portion 12 (e.g., via rotation of a key, knob, or other user input structure connected to the lock).

In certain embodiments, the control box 10 includes a power cord 28. The power cord 28 is configured to conduct electricity from the power grid to the control box 10. Alternatively to employing the power cord 28, the control box 10 can be hardwired to the power grid.

As illustrated in FIG. 2, the control box 10 can include the inner cover or facepack 30. In certain embodiments, at least a portion of the facepack 30 is disposed between the base portion 12 and the outer cover 14 at least when the outer cover 14 is in the closed position. The facepack 30 can be connected to the base portion 12. In certain embodiments, the facepack 30 is connected to the base portion 12 via one or more fasteners 62 (see FIG. 3). In certain embodiments, the facepack 30 is connected to the base portion 12 via a hinge or other mechanical system (not shown).

The facepack 30 can include one or more buttons 36, knobs 40, switches, or other user input structures. In some embodiments, the facepack 30 includes one or more screens 34 (e.g., touch screens and/or displays) on a front side 32 of the facepack 30. In this way, the facepack 30 can function as the user control interface for, for example, an irrigation system and/or a lighting system. For example when configured as an irrigation controller, the user or technician can use the facepack 30 to modify irrigation schedules, flow rates, and many other features or parameters. In certain embodiments, the facepack 30 enables the user to enter and/or select a watering schedule. In certain embodiments, the facepack 30 comprises a memory configured to store an operational program that implements the watering schedule and a processor configured to execute the operational program.

In certain embodiments, the control box 10 is further configured for the user to easily install or remove the one or more modules 128 customizing the sets of features provided by the control box 10. For example, the control box 10 can include a slot 42 (most clearly shown in FIGS. 2 and 2A) in a first side 44 of the facepack 30. The slot 42 is sized and shaped to allow the one or more modules 128 to pass through the first side 44 of the facepack 30 and engage within an interior of the control box 10. In certain embodiments, a removable door 98 (most clearly shown in FIG. 3) is disposed over the slot 42 to minimize dirt and other foreign contaminants from entering the control box 10 through the slot 42 when the one or more modules 128 are not installed and filling the slot 42.

In some embodiments the one or more modules 128 may be a feature module such as those disclosed in U.S. Pat. Nos. 7,953,517; 8,977,400; and 9,678,485 which are hereby incorporated by reference in their entireties. The feature module can have various designs to meet particular needs. Certain embodiments of the feature module modify and/or add features to the control box 10. The added features can customize the existing control box 10 for a particular site.

In certain embodiments, the added features allow the control box 10 to meet the changing watering needs of the particular irrigation site by allowing the control box 10 to be upgraded. In certain embodiments, the feature module allows the control box 10 to be easily and economically configured and/or upgraded by the user to meet the specific needs of the associated irrigation site. This is accomplished by installing at least one feature module that communicates with a processor of the control box 10 and alters the operational program, changes a functionality of an operational program executed by the processor, and/or provides additional memory capacity. The term "landscape control box" as used herein refers to a device, which can function as an irrigation controller, and optionally perform additional functions on a site besides watering, such as the control of landscape lights and water features, or which can function as a controller that controls any combination of or any one of the functions of a lighting controller and a water feature controller.

The feature module allows the homeowner or professional to purchase a base control box 10 with only the features needed for the particular irrigation site. Features can easily be added at a later date to the installed control box 10. In an aspect, the feature module augments the functionality of the control box 10 by permitting access to programming stored within the control box 10, providing memory within the feature module and accessible by the processor of the control box 10, or providing programming stored within the memory of the feature module and accessible by the processor of the control box 10. The feature module can provide the control panel of the control box 10 with additional functionality that can be utilized by the user at the control panel.

The feature module can have various designs to meet particular needs. One form of the feature module is a simple electronic key that enables and/or disables features already programmed into the existing memory of the control box 10. Another form of the feature module provides additional memory, thereby allowing the control box 10 to handle more complex tasks not otherwise capable of being performed by the base control box 10, such as a memory intensive data logging feature. The feature module may contain new programs that are downloaded into the control box 10 and change the functionality of the operational program executed by the control box 10, thereby enhancing, adding to and/or otherwise changing the functional irrigation features available to the user, such as providing the capability of modifying watering schedules based on ET data, or optimizing the flow of water through the irrigation pipes.

Another embodiment of the feature module takes the form of a standard secure digital memory card, also known as an SD card that interfaces with the control box 10 and allows the control box 10 to read and write data files to the SD card.

Figure 2A:
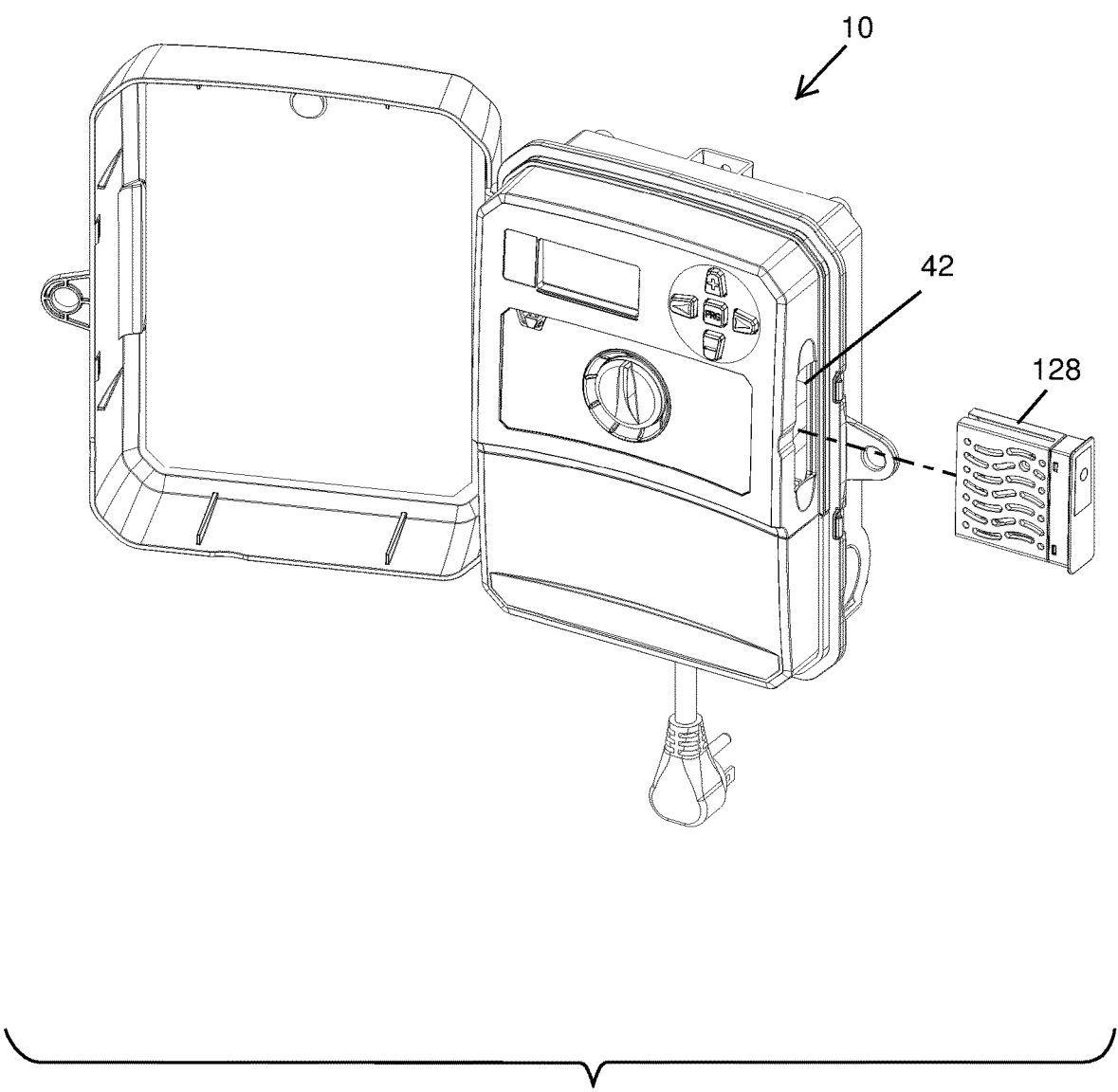
FIG. 2A is similar to FIG. 2 except one of the one or more modules is aligned with the slot prior to the module being inserted into the slot and engaging with the facepack.

In some embodiments the one or more modules 128 are configured as an alternative control module. In contrast to the feature module described above, in certain embodiments, the alternative control module 128 takes over control of the control box 10 by superseding or overriding station programming stored by the control box 10 or input by the user, such as manual input by the user via the one or more buttons 36, knobs 40, switches, or other user input structures at the facepack 30, with its own programming. In certain embodiments, the alternative control module 128 inhibits any station programming from the controller or microcontroller of the control box 10. In certain embodiments, the alternative control module 128 takes over all station programming. In certain embodiments, the alternative control module 128 manages the entire irrigation programming functions then sends a signal to the control box 10 to turn a given station on or off when required. In certain embodiments, the microcontroller in the control box 10 switches the outputs on or off, but only when instructed to do so by the alternative control module 128. This is very different from the augmentation provided by the feature module described above. The feature modules work in conjunction with the processor of the control box 10 whereas the alternative control module 128 supersedes, overrides, or replaces the programming executed by the processor of the control box 10. An exemplary alternative control module 128 is illustrated in FIG. 2A and further described with respect to FIGS. 13-15.

Figure 3:
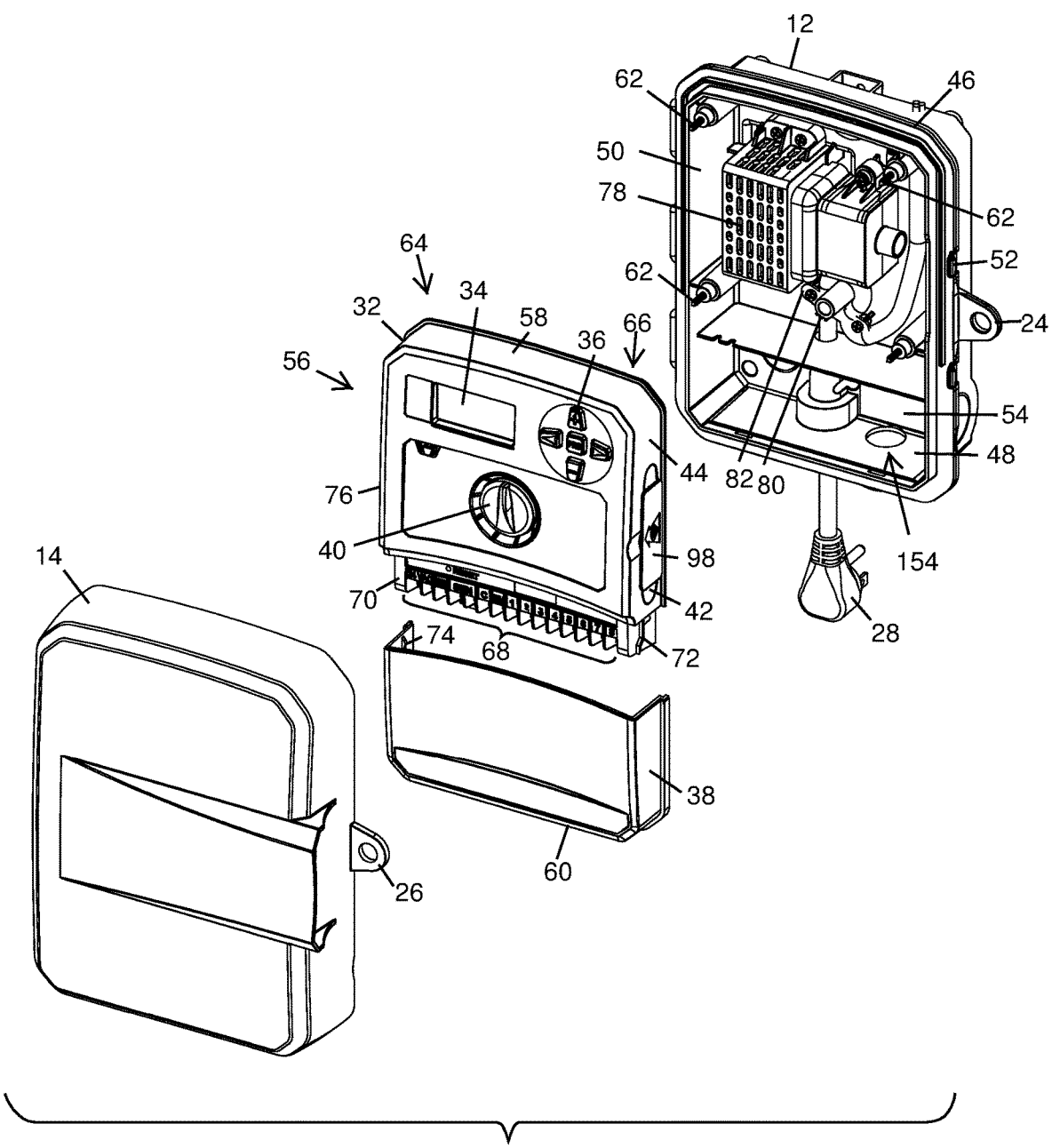
FIG. 3 is an exploded view of the control box of FIG. 1, with the outer cover and the facepack removed from the base portion. The facepack is further shown dissembled into a housing and a terminal cover.

FIG. 3 is an exploded view of the control box 10 of FIG. 1, with the outer cover 14 and the facepack 30 removed from the base portion 12. The facepack 30 is further shown dissembled into a housing 76 and a terminal cover 38. As illustrated in FIG. 3, the base portion 12 can have a generally rectangular prism shape. Other shapes are also possible (e.g., triangular or other polygonal prisms, cylindrical, conical, frustoconical, or other shapes).

In the illustrated example, the base portion 12 includes a first wall 46 (e.g., a top wall), a second wall 48 (e.g., a bottom wall) opposite the first wall 46, a third wall 50 (e.g., a hinge wall) connected to and extending between the first and second walls 46, 48, and a fourth wall 52 (e.g., a latch wall) opposite the third wall 50 and connected to and extending between the first and second walls 46, 48. The base portion 12 can include a fifth wall 54 (e.g., a back wall or mounting wall) connected to one or more of the first, second, third, and fourth walls 46, 48, 50, 52.

The base portion 12 can include a mounting structure configured to facilitate mounting the base portion 12 to a wall, pole, tabletop, fence, or other mounting site. The mounting structure can be, for example, one or more apertures for fasteners, one or more brackets, and/or other structures. The mounting structure(s) can be positioned on a rear surface (not shown) of the fifth wall 54. In some embodiments, one or more mounting structures are positioned on surfaces of the first, second, third, and fourth walls 46, 48, 50, 52.

The facepack 30 can have a second side 56 opposite the first side 44. The facepack 30 can further include a top side 58 and a bottom side 60. The bottom side 60 of the facepack 30 in the illustrated embodiment is also a surface of the terminal cover 38.

FIG. 3 illustrates the terminal cover 38 disengaged from the housing 76 exposing one or more terminals 68 of the housing 76. In certain embodiments, removal of the terminal cover 38 accesses a reset button 70 of the housing 76. In certain embodiments, the user or technician activates the reset button 70 to set the set of features for the control box 10 to factory or other pre-established default values.

In certain embodiments, the housing 76 includes an engagement structure, such as one or more channels 72. The one or more channels 72 are positioned on the housing 76 to engage with an engagement structure on the terminal cover 38, such as one or more protrusions 74. In certain embodiments, the engagement between the one or more channels 72 and the one or more protrusions 74 facilitates the user or technician removing and re-installing the terminal cover 38 relative to the housing 76. In certain embodiments, the terminal cover 38 is disposed so as to prevent the user or technician from accessing the one or more terminals 68 when in a closed or first position and allow the user or technician to access the one or more terminals 68 when in a opened or second position.

The facepack 30 can have a back side 66. The back side 66 of the facepack 30 can include a mounting structure for connecting to the base portion 12. In certain embodiments, the back side 66 of the facepack 30 comprises one or more receptacles 64. The one or more receptacles 64 are configured to receive the one or more fasteners 62 so as to connect the facepack 30 to the base portion 12. In certain embodiments, once the one or more fasteners 62 are disengaged from the one or more receptacles 64, the facepack 30 can be lifted off of the base portion 12.

In certain alternate embodiments, the second side 56 of the facepack 30 includes one or more latching features such as a hinge or other mechanical system. The hinge can be configured to facilitate coupling between the second side 56 of the facepack 30 and the base portion 12. In such an embodiments, the facepack 30 can be swung open relative to the base portion 12.

In certain embodiments, the interior of the base portion 12 comprises electronics, for example, a power supply 78, microcontroller, memory, and/or other electrical components known to a person having ordinary skill in the art. In certain embodiments, the control box 10 implements station programming stored in the memory of the control box 10. In certain embodiments, the control box 10 implements station programming input by the user, such as through manual input via the one or more buttons 36, knobs 40, switches, or other user input structures at the facepack 30. In certain embodiments, the control box 10 manages the entire irrigation programming functions by sending signals, for example, to irrigation valves that turn a given station on or off. In certain embodiments, the microcontroller in the control box 10 switches the outputs on or off.

In certain embodiments, the power supply 78 is sized and shaped to be at least partially disposed in the interior of the base portion 12. One or more of the electronic components electrically connects to the facepack 30 via one or more cables or wires. In certain embodiments, the one or more electronic components disposed within the interior of the base portion 12 electrically connects to the facepack 30 via a ribbon cable.

In certain embodiments, the interior of the base portion 12 comprises a strain relief post 80 and a clamp 82. In certain embodiments, the strain relief post 80 is sized and shaped to allow the power chord 28 to wrap at least partially around the strain relief post 80. In certain embodiments, the clamp 82 attaches to the base portion 12 to secure the power chord 28 in place after the power cord 28 is wrapped at least partially around the strain relief post 28.

In certain embodiments, the rotary shaft 88 extends from one side of a multi position rotary selector switch 122. In certain embodiments, the multi position rotary selector switch 122 is coupled to a component of the housing 86. In certain embodiments, the component is the printed circuit board 86. For example, in certain embodiments, a portion of the rotary shaft 88 extends from the rotary selector switch 122 which is mounted to a first side of the circuit board 86 through the circuit board 86 towards the housing 76.

FIG. 4 is an exploded view of the housing 76 from FIG. 3 showing the printed circuit board 86 and the knob 40 disassembled from a back side and a front side of a cover 84 of the housing 76, respectively. In FIG. 4, the rotary shaft 88 extends from the printed circuit board 86 towards a hole 90 in the cover 84. In certain embodiments the rotary shaft 88 is positioned to allow the knob 40 to engage the rotary shaft 88 along the axis 120 when the printed circuit board 86 is secured to the back side of the cover 84.

In certain embodiments, the printed circuit board 86 includes the one or more terminals 68. The one or more terminals 68 allow the user or technician to connect one or more wires coming from devices in the landscaping to the control box 10.

In certain embodiments, the user or technician slides at least a portion of the one or more modules 128 through the slot 42 in the facepack 30 and then into a guide 94 or recess. In the illustrated embodiment, the guide 94 or recess is disposed in the printed circuit board 86. In other embodiments, the guide 94 is disposed in a structure separate from the printed circuit board 86. In certain embodiments, the guide 94 in combination with the slot 42 facilitates the user or the technician aligning a distal end of the one or more modules 128 with one or more contacts 96 on the printed circuit board 86.

In certain embodiments, the one or more contacts 96 are grouped into a plurality of subgroups with each subgroup being configured to couple to a single module. In this way, the housing 76 is able to couple to the one or more modules 128 at the same time if desired.

In certain embodiments, the guide 94 has a rectangular shape. Of course the guide 94 can have other shapes depending on the shape of the one or more modules 128. In certain embodiments, the guide 94 is sized to receive the one or more modules 128. In certain embodiments, the slot 42 is sized to receive the one or more modules 128. For example, in certain embodiments, the slot 42 is a double long slot sized to accept two modules 128 arrange side-by-side. In certain embodiments, the facepack 30 includes a second slot 42 to accept a second module.

The knob 40 and the cover 84 desirably include interacting structure to couple the knob 40 to the cover 84. As will be clear from the disclosure below, the interacting structure mounts the knob 40 to the cover 84. In certain embodiments, a portion of the interacting structure desirable is formed on the knob 40 and another portion of the interacting structure is formed on the cover 84. The term "mount," when used with reference to the relation between the knob 40 and the cover 84, does not imply that the knob 40 is immobilized or fixed. Rather, this term is meant to describe the condition in which the interacting structure inhibits movement of the knob 40 relative to the cover 84 in at least one degree of freedom (e.g., forward/backward or parallel to axis 120, up/down, left/right, yaw, pitch, or roll). In certain embodiments, inhibiting movement does not mean the knob 40 cannot be removed from the cover 84 if significant tension is applied to the knob 40. The user or technician would not be expected to apply tension, let alone significant tension, during normal operation of the knob 40.

In the illustrated embodiment, as well as in those later described, the interacting structure inhibits forward movement of the knob 40 along the axis 120 in a direction away from the cover 84. In the illustrated embodiment, the interacting structure permits roll or rotational movement of the knob 40.

In certain embodiments, the interacting structure on the cover 84 is a lip 92 positioned to engage the knob 40 and inhibit the knob 40 from disengaging from the rotary shaft 88. In the illustrated embodiment, the lip 92 is disposed in the hole 90 in the cover 84. In other embodiments, the lip 92 is not disposed in the hole 90. In certain embodiments, the lip 92 is spaced from a center of the hole 90 a distance that is not greater than a radius of the knob 40. In this way, the knob 40 can engage both the rotary shaft 88 and the lip 92 at the same time.

Figure 5:
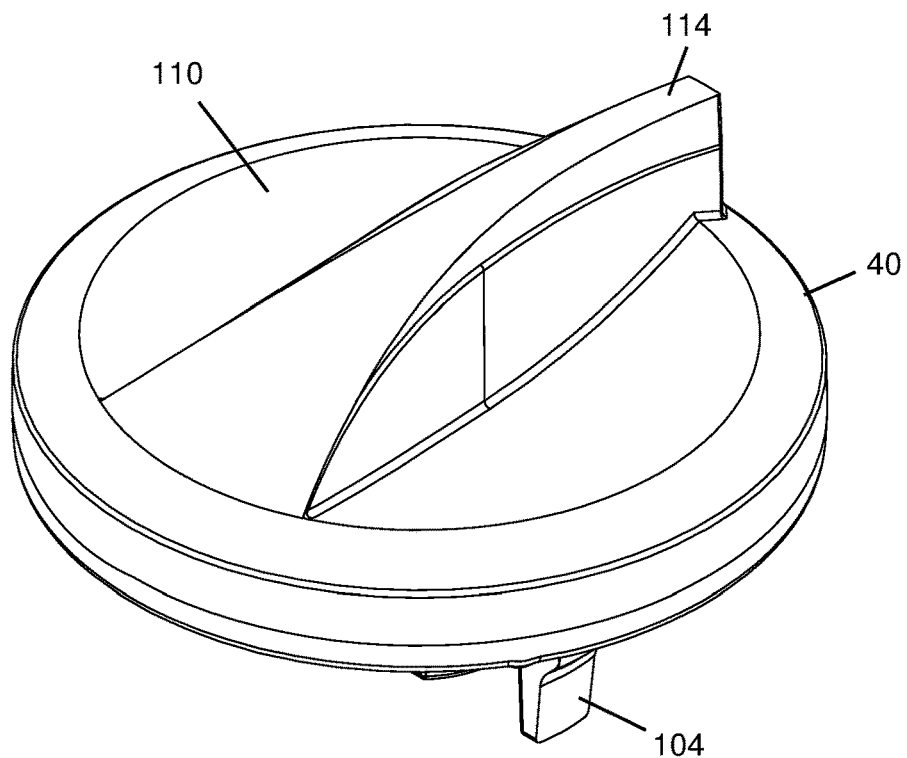
FIG. 5 is a front perspective view of the knob from FIG. 4 showing a ridge on a front side of the knob for a user to selectively rotate the rotary shaft of the printed circuit board when the knob is engaged with the rotary shaft.

FIG. 5 is a front perspective view of the knob 40 from FIG. 4 showing a ridge 114 on a front side 110 of the knob 40 for a user to selectively rotate the rotary shaft 88 of the printed circuit board 86 when the knob 40 is engaged with the rotary shaft 88. Of course the front side 110 of the knob 40 could have other projecting structures such as, for example, levers or posts to facilitate manual manipulation by the user or the technician. In other embodiment, the knob 40 does not include structures projecting from the front side 110.

Figure 6:
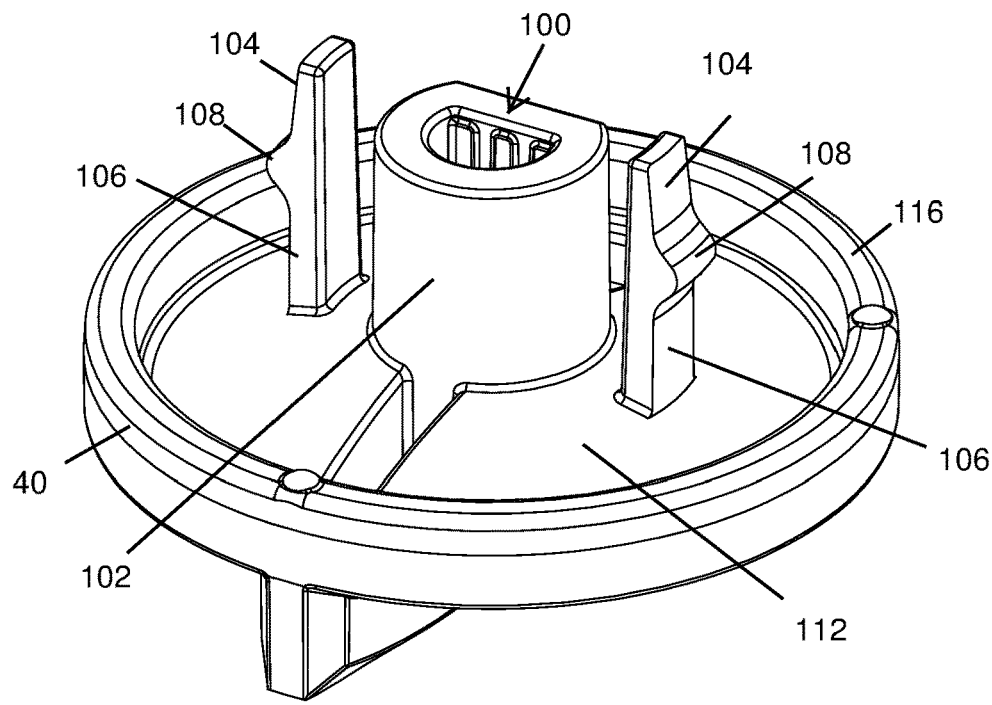
FIG. 6 is a rear perspective view of the knob from FIG. 4 showing a hub and a first portion of the interacting structure configured for engagement with the rotary shaft and a second portion of the interacting structure on the cover, respectively.

FIG. 6 is a rear perspective view of the knob 40 from FIG. 4 showing a hub 102 and a first portion of the interacting structure configured for engagement with the rotary shaft 88 and a second portion of the interacting structure on the cover 84, respectively. In certain embodiments, the hub 102 includes an opening/receptacle 100 sized and shaped to receive at least a portion of the rotary shaft 88 when the facepack 30 is coupled to the base portion 12. The shape and size of the opening/receptacle 100 is selected to prevent free rotation of the rotary shaft 88 relative to the opening/receptacle 100. In the illustrated embodiment, the opening/receptacle 100 and the rotary shaft 88 have generally semi-circle cross-sectional shapes.

In certain embodiments, a cross-section of the opening/receptacle 100 matches a cross-section of the rotary shaft 88. Of course the cross-section of the opening/receptacle 100 need not match the cross-section of the rotary shaft 88 to prevent free rotation of the rotary shaft 88 relative to the opening/receptacle 100. In certain embodiments, the opening/receptacle 100 forms a light press fit with the rotary shaft 88. In certain embodiments, the opening/receptacle 100 forms a net fit with the rotary shaft 88. In certain embodiments, the opening/receptacle 100 forms a slip fit over the rotary shaft 88. In certain embodiments, the opening/receptacle 100 and the rotary shaft 88 are both circular in cross-section and rely on friction for the rotary shaft 88 to rotate in concert with the knob 40.

As seen in FIG. 6, a portion of the interacting structure on the knob 40 comprises one or more posts 104. In certain embodiments, the one or more posts 104 extend upwardly from a back side 112 of the knob 40. The knob 40 desirably includes a pair of posts 104. The knob 40 can also include additional posts to suit a specific application. For example, where the knob 40 is relatively large, the knob 40 can include four posts 104 annularly arranged for greater stability. In certain embodiments, the at least one post 104 is a single post 104 that has a tubular shape surrounding the hub 102.

In certain embodiments, each post 104 includes a shaft or shank 106, attached to and extending upwardly from the knob 40. The posts 104 can have a variety of lengths and a variety of distances between them, depending upon the particular application and the particular cover 84 with which they are to interact to mount the knob 40. In certain embodiment, the posts 104 are spaced a common distance or radius from a rotational center of the knob 40.

In certain embodiments, each post 104 has a length of about 0.25 inches to 1.0 inch, and more particularly a length of about 0.5 inches; however, longer or shorter lengths also are possible. In certain embodiments, the posts 104 are laterally spaced wide enough apart to accommodate the hub 102. In certain embodiments, the posts 104 are spaced apart by a distance between ½ inch and 2 inches, and more particularly by a distance equal to about ⅗ inch. The shank 106 of each post 104 has a cross-section sufficient to perform its structural function, as described in more detail below, and depends upon the material chosen for the knob 40 and shank 106. In certain embodiments, the shank 106 is configured to flex or deflect in a direction towards the axis 120 to allow the protrusion 108 to pass through the hole 90. In certain embodiments, contact caused by dimensional interference between the protrusion 108 and the hole 90 causes the shank 106 to flex or deflect towards the axis 120. Once through the hole 90, the shank 106 at least partially moves back towards its original position and the protrusion 108 wraps around and contacts the lip 92. The illustrated posts 104 comprise a plastic material.

In certain embodiments, the posts 104 have a circular cross-sectional shape. Of course the cross-sectional shape of the posts 104 is not limited to circular and can have any other shape or combinations of shapes. In the illustrated embodiment, the posts 104 have a generally tapering rectangular cross-sectional shape from the back side 112 of the knob 40 to a tip or distal end of the posts 104 outside of a protrusion 108 region of the shank 106.

In certain embodiments, at least a portion of a surface of the post 104 has an arcuate shape and is positioned to slide against a portion of the hole 90 in the cover 84 when the knob 40 is rotated relative to the cover 84. In this way, the arcuate shape of the post 104 increases a size of a contact area with the cover 84 facilitating ease of knob 40 rotation.

In certain embodiments, at least one protrusion 108 extends outwardly from the shank 106. In the illustrated embodiment, the protrusion 108 comprises an enlarged portion of the shank 106 at a location between the back side 112 of the knob 40 and the tip, distal end or head of the shank 106. In certain embodiments, the protrusion 108 is disposed at the tip at the end distal from the back side 112 of the knob 40.

At least a portion of the protrusion 108 of each post 104 is larger than the shank 106. In certain embodiments, the protrusion 108 has a maximum width of 1.2 to 2.5 times the width of the shank 106. In the illustrated embodiment, the protrusion 108 has a generally arcuate shape along a length of the shank 106. It will be understood, however, that the protrusion 108 can take a variety of other shapes, such as for example, solid or hollow conical, arrowheads, barbs, spheres, mushroom heads, and other types of outwardly or radially projecting structures from the shank 106.

In certain embodiments, the knob 40 is disposed at least partially in the hole 90 when assembled to the cover 84. In certain embodiments, the hub 102 engages with the rotary shaft 88 so as to transfer rotational motion of the knob 40 to the rotary shaft 88. In certain embodiments, the one or more posts 104 engage with the cover 84 so as to inhibit movement of the knob 40 away from the cover 84.

Figure 7:
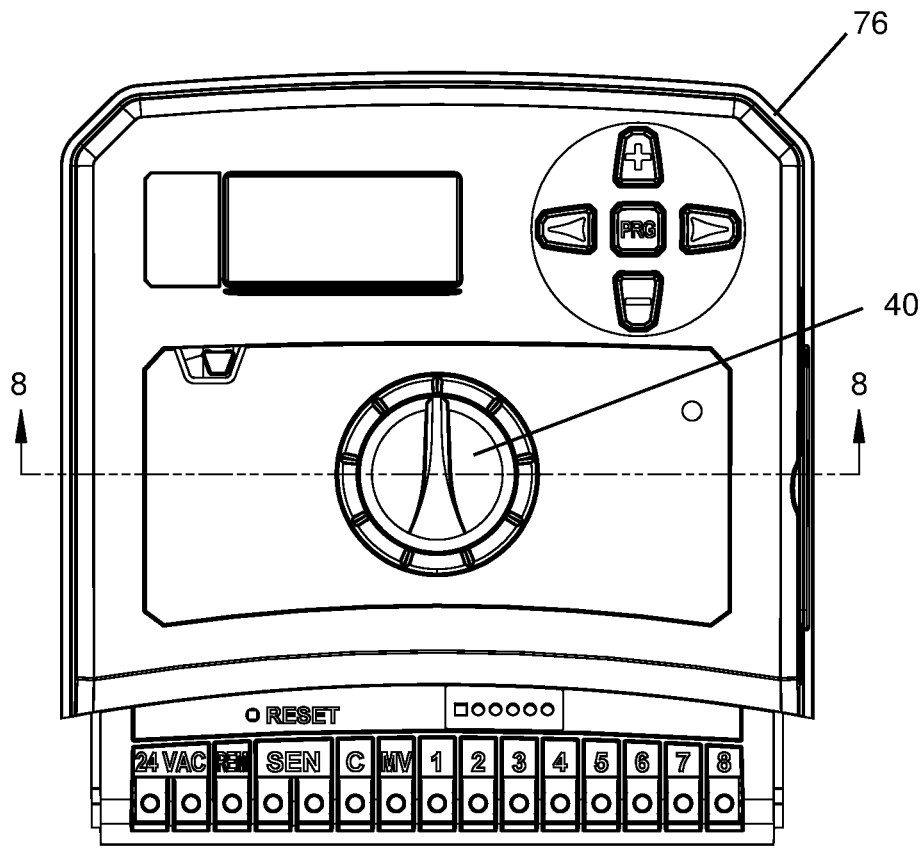
FIG. 7 is a front view of the housing of the facepack with the knob partially installed on the cover.
Figure 8:
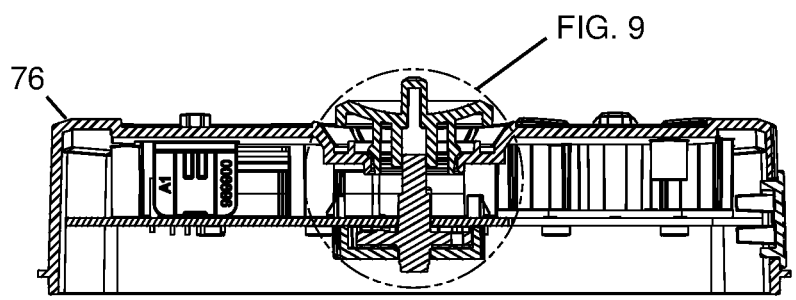
FIG. 8 is a cross-section view taken along lines 8-8 of FIG. 7 showing the knob partially installed on the rotary shaft.
Figure 9:
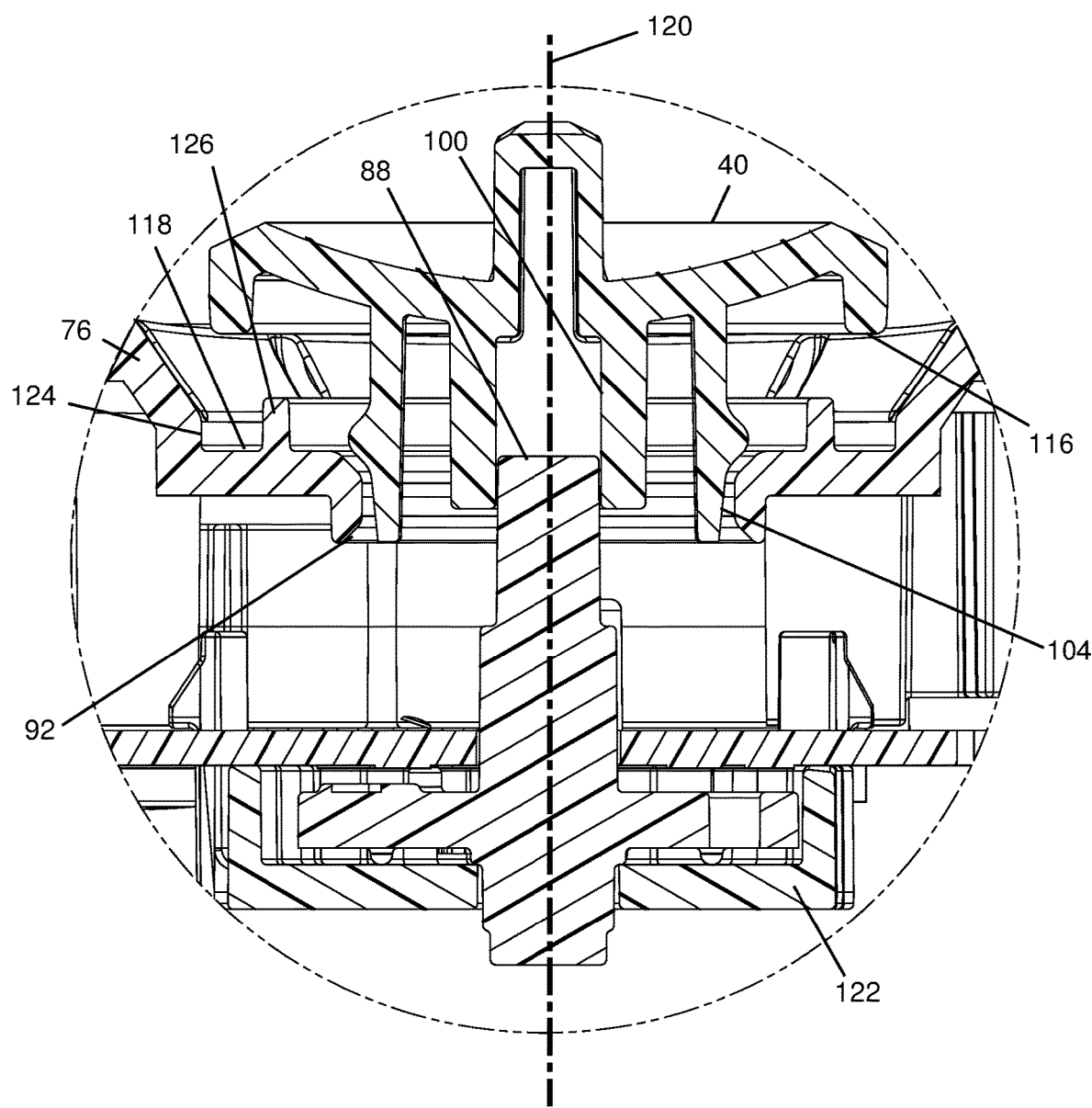
FIG. 9 is a close-up partial view from FIG. 8 showing the hub of the knob partially installed on the rotary shaft and the one or more posts aligned with the hole but not engaged with the lip of the cover.

FIG. 7 is a front view of the housing 76 of the facepack 30 with the knob 40 partially installed on the cover 84. FIG. 8 is a cross-section view taken along lines 8-8 of FIG. 7 showing the knob 40 partially installed on the rotary shaft 88. FIG. 9 is a close-up partial view from FIG. 8 showing the hub 102 of the knob 40 partially installed on the rotary shaft 88 and the one or more posts 104 aligned with the hole 90 but not engaged with the lip 92 of the cover 84.

As explained above, an embodiment of the interacting structure for coupling or mounting the knob 40 to the cover 84 is the one or more posts 104 of the knob 40 and the lip 92 of the cover 84. In certain embodiments, a portion of the interacting structure desirably is formed on the knob 40 and another portion of the interacting structure is formed on the cover 84. As also explained above, when engaged, the interacting structure inhibits movement of the knob 40 relative to the cover 84 in at least one degree of freedom (e.g., forward/backward or parallel to axis 120, up/down, left/right, yaw, pitch, or roll). In the illustrated embodiment, the interacting structure inhibits at least forward movement of the knob 40 along the axis 120 in a direction away from the cover 84. In the illustrated embodiment, the interacting structure permits roll or rotational movement of the knob 40.

In certain embodiments, the interacting structure inhibits up/down and left/right movements of the knob 40 relative to the cover 84. In certain embodiments, the interacting structure inhibits excessive yaw and pitch movements of the knob 40 relative to the cover 84.

As shown in FIG. 9, the tip or distal portion of the shank 106 of the post 104 is disposed in the hole 90 in the cover 84. In certain embodiments where the shank 106 tapers in a direction away from the back side 112 of the knob 40, the tapering shape facilitates alignment and initial insertion of the one or more posts 104 into the hole 90. As is also shown in FIG. 9, the protrusion 108 on the shank 106 has yet to pass through the hole 90 to contact the lip 92 on the cover 84.

In certain embodiments, the knob 40 comprises a contact surface 116 (most clearly shown in FIG. 6). In certain embodiments, the contact surface 116 is configured to abut or closely abut a surface on the cover 84 and inhibit at least backward movement of the knob 40 along the axis 120 in a direction towards the base portion 12 when the knob 40 is fully installed on the cover 84. For example, in certain embodiments, the cover 120 comprises an abutment surface 118. As is illustrated in FIG. 9, at least a portion of the abutment surface 118 faces at least a portion of the contact surface 116. In FIG. 9, since the knob 40 is not fully installed on the cover 84, the abutment surface 118 is yet to be in contact with the contact surface 116 of the knob 40.

In certain embodiments, the contact surface 116 and the abutment surface 118 have complementary annular shapes. In certain embodiments, the annular shapes allow contact to occur between the knob 40 and the cover 84 independent of the rotational position of the knob 40 relative to the cover 84. In this way, the annular shapes facilitate the user rotating the knob 40. In certain embodiments, one or both of the contact surface 116 and the abutment surface 118 does not have a continuous annular shape. In certain embodiments, the contact surface 116 and/or the abutment surface 118 span less than 360 degrees about the axis 120.

In certain embodiments, a rotary bearing or other friction reducing structure is employed to facilitate rotation of the knob 40. In certain embodiments, the rotary bearing is disposed about the rotary shaft 88. In certain embodiments, the rotary bearing is disposed between the contact surface 116 and the abutment surface 118.

Figure 10:
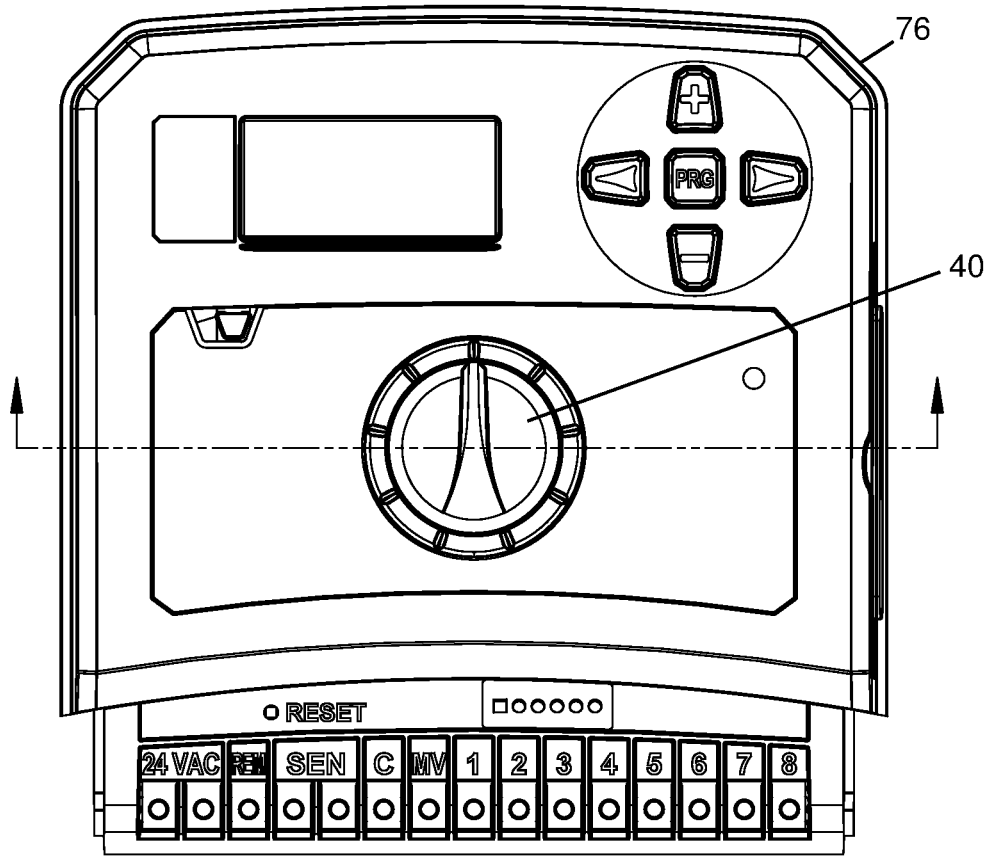
FIG. 10 is similar to FIG. 7 except the knob has been pushed further towards the cover engaging the one or more posts with the lip of the cover so as to inhibit removal of the knob from the rotary shaft.
Figure 11:
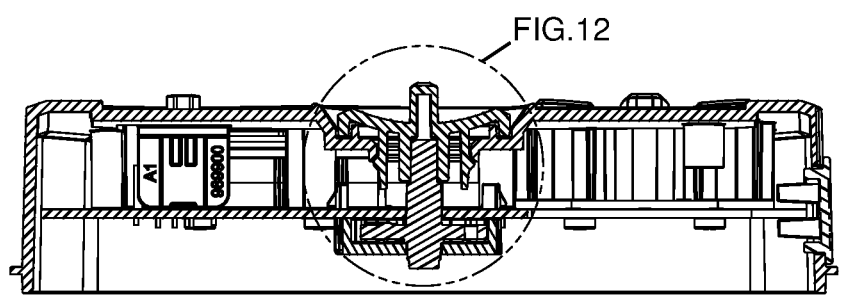
FIG. 11 is a cross-section view taken along lines 11-11 of FIG. 10 showing the knob installed on the rotary shaft.
Figure 12:
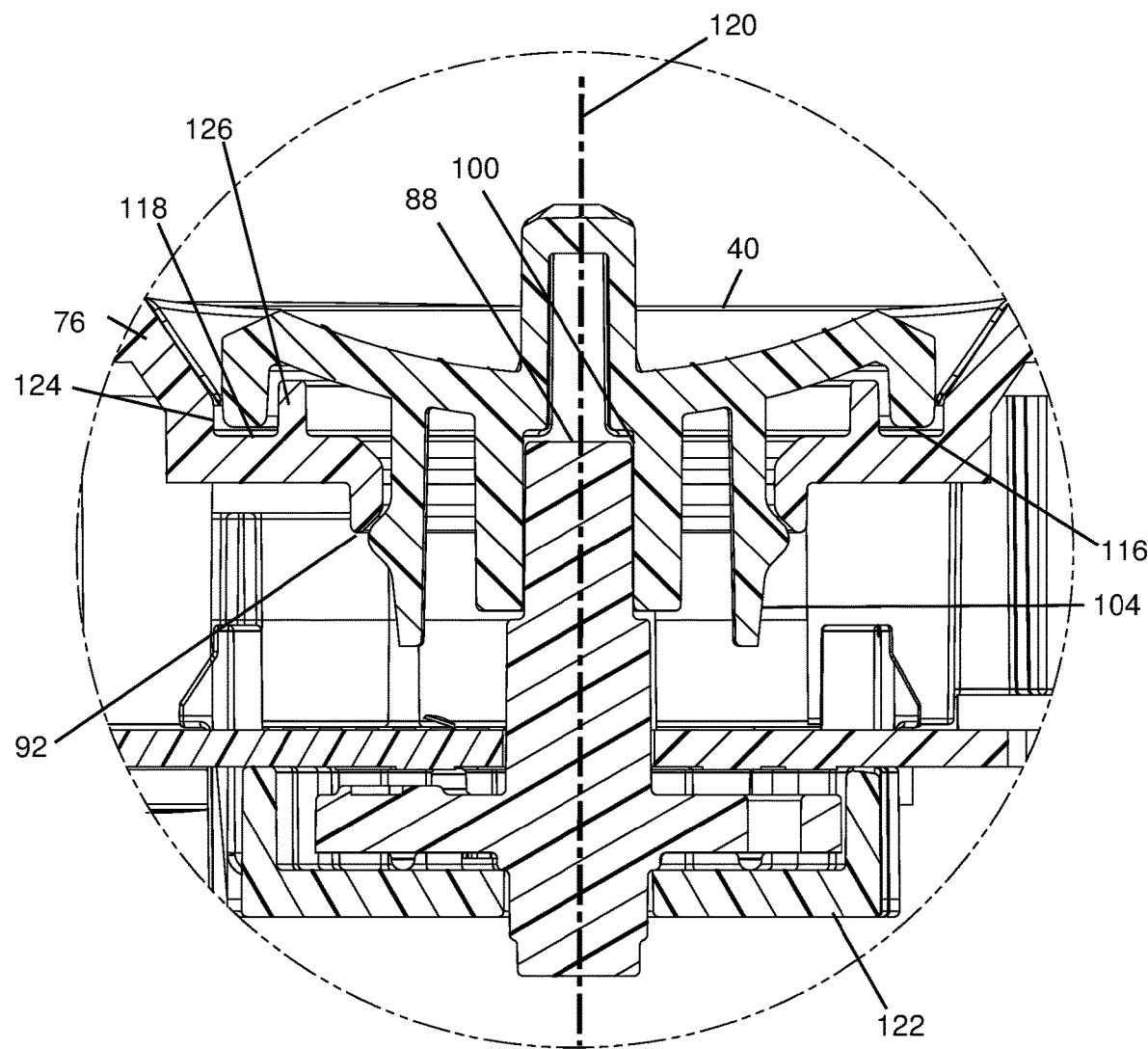
FIG. 12 is a close-up partial view from FIG. 11 showing the hub of the knob installed on the rotary shaft and the one or more posts engaged with the lip on the cover inhibiting removal of the knob from the rotary shaft.

FIG. 10 is similar to FIG. 7 except the knob 40 has been pushed further towards the cover 84 engaging the one or more posts 104 with the lip 92 of the cover 84 so as to inhibit removal of the knob 40 from the rotary shaft 88. FIG. 11 is a cross-section view taken along lines 11-11 of FIG. 10 showing the knob 40 installed on the rotary shaft 88. FIG. 12 is a close-up partial view from FIG. 11 showing the hub 102 of the knob 40 installed on the rotary shaft 88 and the one or more posts 104 engaged with the lip 92 on the cover 84 inhibiting removal of the knob 40 from the rotary shaft 88.

As illustrated in FIG. 12, the interacting structure inhibits movement of the knob 40 relative to the cover 84 in at least one degree of freedom (e.g., forward/backward or parallel to axis 120, up/down, left/right, yaw, pitch, or roll). In the illustrated embodiment, the interacting structure inhibits at least forward movement of the knob 40 along the axis 120 in a direction away from the cover 84. In the illustrated embodiment, the interacting structure permits roll or rotational movement of the knob 40.

As shown in FIG. 12, the tip or distal portion of the shank 106 and the protrusion 108 have passed through the hole 90 in the cover 84. In certain embodiments where the shank 106 tapers in a direction away from the back side 112 of the knob 40, the tapering shape facilitates the protrusion 108 on the shank 106 passing through the hole 90 to contact the lip 92 on the cover 84.

As illustrated in FIG. 12, the contact surface 116 is abutting or closely abutting the abutment surface 118 on the cover 84 and inhibits at least backward movement of the knob 40 along the axis 120 in the direction towards the base portion 12. In FIG. 12, since the knob 40 is fully installed on the cover 84, the abutment surface 118 is in contact with or in close proximity to the contact surface 116 of the knob 40.

In some embodiments the housing 76 can comprise a first annular wall 124 and a second annular wall 126 extending outward of the contact surface 116. As best seen in FIG. 12, the abutment surface 118 sits between the first and second annular walls 124 and 126 when the knob 40 is installed to the housing 76. This arrangement may create a tortuous path that can prevent water from entering the interior of the facepack 30 and contacting the circuit board 86.

In certain embodiments, the interacting structure which couples or mounts the knob 40 to the cover 84 not only inhibits removal of the knob 40 from the cover 84 but also indirectly maintains engagement between the rotary shaft 88 and the knob 40 when the facepack 30 is coupled to the base portion 12. In this way in certain embodiments, friction is not needed between the rotary shaft 88 and the opening/receptacle 100 to inhibit the user or technician from accidently removing the knob 40 from the rotary shaft 88 or the knob 40 falling off of the rotary shaft 88 due to, for example, prolonged thermal cycling. Instead, the interacting structure inhibits removal or dislodgment of the knob 40 from the cover 84.

Without a significant friction fit between the rotary shaft 88 and the opening/receptacle 100, temperature changes or other environment factors experienced by the control box 10 that, for example, expand or contract components within the control box 10 are less likely to cause tension on the rotary shaft 88. For example, when changing temperatures cause the cover 84 and the printed circuit board 86 to slightly separate or move apart, the separation can apply tension to the rotary shaft 88 until the knob 40 overcomes static friction and slides slightly away from the printed circuit board 86 relieving at least some of the tension. Without the interacting structure, over time this thermal cycling can create a slow procession of the knob 40 moving away from the cover 84 until either the hub 102 disengages from the rotary shaft 88 rendering the knob 40 ineffective to control the control box 10 or the knob 40 falls entirely off the rotary shaft 88. In addition, tension applied to the rotary shaft 88 due to friction may be detrimental to the printed circuit board 86 and operation of the control box 10 over time.

In certain embodiments the level of friction between the rotary shaft 88 and the hub 102 is low enough to allow the hub 102 to slide along the rotary shaft 88 before detrimental tension is created between the hub 102 and the rotary shaft 88. In such an embodiment, the interacting structure, not the friction between the rotary shaft 88 and the hub 102, inhibits removal of the knob 40 from the rotary shaft 88.

In certain embodiments, even though the interacting structure is not between the hub 102 and the rotary shaft 88, the interacting structure indirectly maintains the hub 102 in an operable position relative to the rotary shaft 88 via the cover 84.

Figure 13:
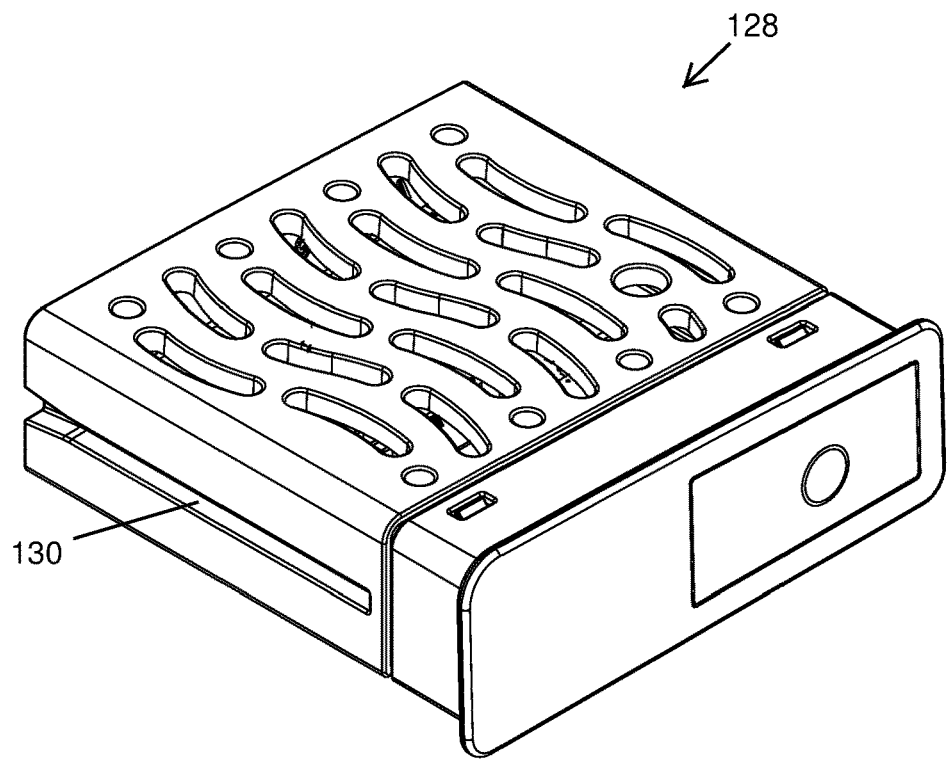
FIG. 13 is a front perspective view of the module from FIG. 2A showing a groove on an edge of the module which engages with a guide on the printed circuit board to maintain alignment of connector on the module with the one or more contacts as the module is being inserted into the slot.
Figure 14:
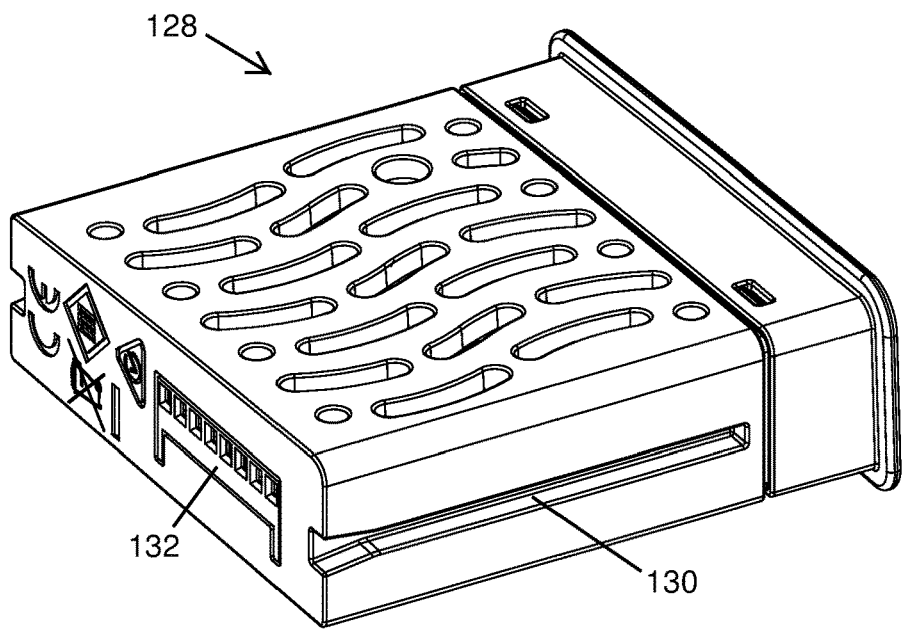
FIG. 14 is a rear perspective view of the module from FIG. 2A showing the connector which engages with the one or more contacts on the facepack when the module is fully inserted into the slot.

FIG. 13 is a front perspective view of the module 128 from FIG. 2A when the module 128 is configured as the alternative control module 128. FIG. 14 is a rear perspective view of the alternative control module 128. In certain embodiments, the alternative control module 128 includes a groove 130 on an edge of the alternative control module 128. The groove 130 is configured to engage with the guide 94 on the printed circuit board 86 to maintain alignment between a connector 132 on the alternative control module 128 and the one or more contacts 96 as the alternative control module 128 is being inserted into the slot 42. In certain embodiments, the connector 132 engages with the one or more contacts 96 on the facepack 30 when the alternative control module 128 is fully inserted into the slot 42.

In certain embodiments, the alternative control module 128 can facilitate expanded communications, e.g. wireless communications. In certain embodiments, the alternative control module 128 receives sensor information data and/or weather information data. This information may include, but is not limited to, flow rate, rain event, temperature, weather information, predicted future weather patterns, solar radiation, wind speed, relative humidity, motion, voltage, current, and soil moisture.

In certain embodiments, the sensor information data and/or weather information data is received by an Internet of Things (IoT) cloud server in communication with the alternative control module 128. In certain embodiments, the IoT cloud server determines or changes the station programming based on the sensor information data and/or weather information data and then send signals to the alternative control module 128. In certain embodiments, a user enters a preferred irrigation schedule that is stored in the alternative control module 128 through the IoT cloud server. In certain embodiments, the IoT cloud server determines a schedule percentage modifier value based on the sensor information data and/or weather information data and then sends the schedule percentage modifier value to the alternative control module 128. In certain embodiments, the alternative control module 128 can calculate a new irrigation schedule based on the original irrigation schedule and the schedule percentage modifier value. In this way, the alternative control module 128 need not receive the sensor information data and/or weather information data.

In certain embodiments, the alternative control module 128 communicates with an external rain sensor, a local area network (LAN) or mobile carrier's network, a soil moisture sensor, or a weather station. For example, the alternative control module 128 can utilize RF, infrared or other wireless circuitry (receiver or transmitter, or transceiver) to communicate with a remote device.

Figure 15:
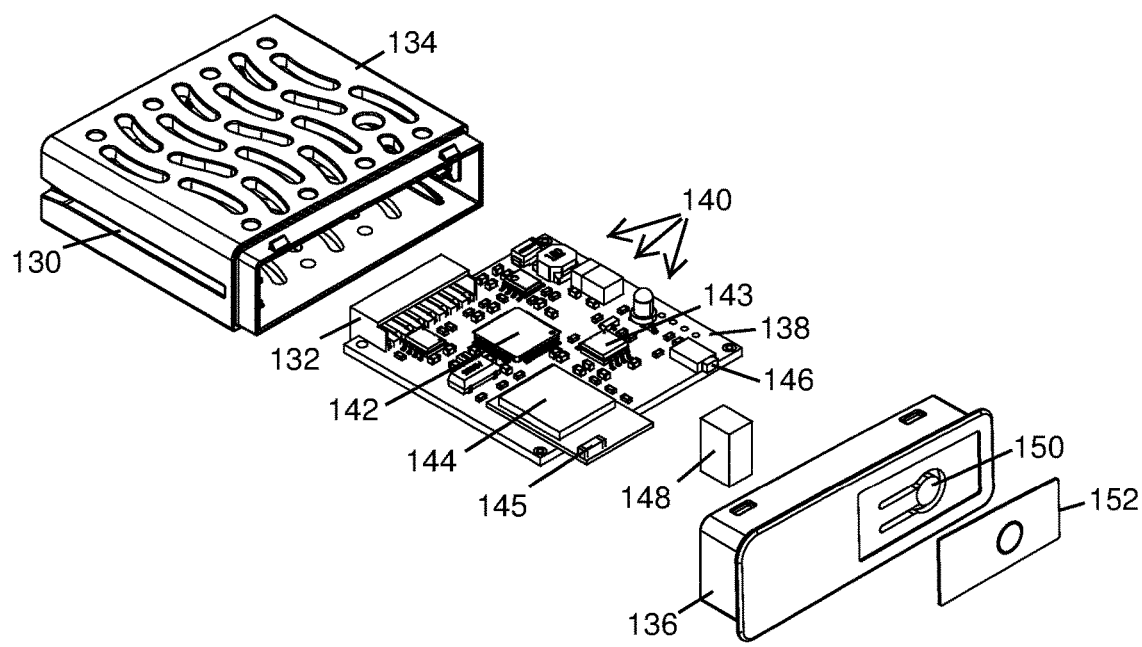
FIG. 15 is an exploded view of the module from FIG. 2A showing a printed circuit board supporting one or more electronic components within the module.

FIG. 15 is an exploded view of the alternative control module 128 from FIG. 2A. In certain embodiments, the alternative control module 128 comprises a housing 134 and a cover 136 securable to the housing 134. In certain embodiments, the housing 134 and the cover 136 define an interior space for one or more electronics 140. Of course the alternative control module 128 could comprises a single monolithic shell formed around the one or more electronics 140.

In certain embodiments, at least a portion of the cover 136 is located outside the facepack 30 while the housing 134 is located within the facepack 30 when the alternative control module 128 is fully inserted into the slot 42. In certain embodiments, the cover 136 can comprises a solid outer surface to minimize dirt and other foreign contaminants from entering the alternative control module 128 when the cover 136 is extending outside the slot 42. In certain embodiments, the cover 136 can comprises a solid outer surface to facilitate manipulation of the alternative control module 128 by the user. The housing 124 or at least the portion of the alternative control module 128 disposed in the facepack 30 can include vents or other openings in its outer surface to facilitate thermal management of the one or more electronics 140.

In certain embodiments, the cover 136 secures to the housing 134 via one or more complementary engagement structures including, for example, adhesives, fasteners, detents, projections, recesses, or other known securement structures. In certain embodiments, a portion of the cover 136 is press fit into the housing 134 securing the cover 136 to the housing 134.

In certain embodiments, the alternative control module 128 comprises a printed circuit board (PCB) 138 supporting the one or more electronics 140. Exemplary electronics include a microcontroller 142, a memory 143, a wireless communication module 144, a switch 146, a processor and/or other electronic components known in the art. In certain embodiments, the wireless communication module 144 is implemented as a WiFi module and/or a cellular module. In certain embodiments, the wireless communication module 144 comprises an antenna 145. In certain embodiments, the microcontroller 142 and the memory 143 manage all station programming.

In certain embodiments, the alternative control module 128 comprises a damper 148. In certain embodiments, the damper 148 attenuates vibrations experienced by the PCB 138 and the one or more electronics 140. In certain embodiments, the damper 148 is disposed within the alternative control module 128 and in simultaneous contact with the cover 136 and the PCB 138.

In certain embodiments, the one or more electronics 140 comprises the wireless communication module 144 such as, for example, the Wi-Fi module and/or the cellular module. In the illustrated embodiment, the wireless communication module 144 is on the same printed circuit board 138 as other electronics and located within the alternative control module 128. In an embodiment, power for the alternative control module 128 is derived from the control box 10 via the connector 132.

In certain embodiments, the Wi-Fi module connects the alternative control module 128 to the LAN via a Wi-Fi connection. In certain embodiments, multiple control boxes 10 with multiple alternative control modules 128 connect to a single LAN. In a further embodiment, multiple control boxes 10 may be serviced by a single alternative control module 128.

In certain embodiments, the wireless communication module 144 comprises the cellular module. In certain embodiments, the cellular module communicates to the Internet via a mobile carrier's network. Depending on the location and carrier, various standards, such as GPRS, GSM, and CDMA, and the like may apply.

The wireless communication module 144 optionally comprises a sensor input capability, and thereby allow the one or more electronics 140 to receive sensor information when controlling the control box 10. This information may include, but is not limited to, flow rate, rain event, temperature, solar radiation, wind speed, relative humidity, motion, voltage, current, and soil moisture.

In certain embodiments, the user controls the alternative control module 128 from an Internet enabled user device via its web browser, custom software, or a dedicated application. Internet enabled user devices include tablets, smart phones, computers, laptops, tablets, and the like.

In certain embodiments, the user sends commands to a webpage provided by the alternative control module 128. In certain embodiments, the user interacts with an application running on their Internet enabled user device. In certain embodiments, the application is written for various platforms, such as iPhone, Android, or the like. The application then communicates with the alternative control module 128.

In certain embodiments, the alternative control module 128 communicates with an IoT cloud server on the Internet. In certain embodiments, a user accesses the IoT cloud server via, for example, a router that is connected to an Internet Service Provider (ISP). The IoT cloud server hosts an application that provides the user with control and monitoring capability of the control box 10 via the alternative control module 128. In this way, the alternative control module 128 works in harmony with the IoT cloud server to allow the user to enter and monitor all irrigation functions through the IoT cloud server via their Internet enabled user device. In certain embodiments, the IoT cloud server is a HydraWise server (https://www.hunterindustries.com/irrigation-product/hydrawise-cloud-software).

In certain embodiments, the alternative control module 128, via the IoT cloud server, turns the control box 10 into a smart controller. In certain embodiments, the IoT cloud server receives sensor information data and/or weather information data. This information may include, but is not limited to, flow rate, rain event, temperature, weather information, predicted future weather patterns, solar radiation, wind speed, relative humidity, motion, voltage, current, and soil moisture. With this data in certain embodiments, the IoT cloud server fine tunes its control of the irrigation system to water only when necessary. In certain embodiments, the IoT cloud server utilizes predicted future weather patterns to modify the irrigation as required based on weather information data and/or other sensor information data.

In certain embodiments, the IoT cloud server employs an automated watering schedule that uses information about environmental conditions to ensure the user's plants get the optimum amount of water. In certain embodiments, the IoT cloud server, via the alternative control module 128, will vary the watering frequency based on actual evaporation and rainfall in the user's area on a day-to-day basis. In certain embodiments, the IoT cloud server can adjust the length of watering without adjusting frequency based on weather information data. For example, the IoT cloud server can select the most accurate weather information available to fine tune its control of the irrigation system.

In certain embodiments, with the alternative control module 128 installed into the control box 10, the control box 10 is operated by the IoT cloud server. In certain embodiments, the alternative control module 128 manages the entire irrigation programming functions then sends a signal to the microcontroller in the control box 10 to turn a given station on or off when required. In certain embodiments, the microcontroller in the control box 10 switches the outputs on or off, but only when instructed to do so by the alternative control module 128. In certain embodiments the microcontroller 142 can supersede, override, or replace the programming executed by the processor of the control box 10. In certain embodiments, the alternative control module can inhibit the functions of one or more of the operator inputs 36 and 40 on the facepack 30.

In certain embodiments, the switch 146 is configured to receive one or more control signals from the user. In certain embodiments, the control signal received by the switch 146 is an on-signal and/or an off-signal. For example, the user can send a control signal via the switch 146 to the alternative control module 128 that instructs the microcontroller 142 to begin a provisioning mode that allows the processes necessary to identify the alternative control module 128 with a user account on the IoT server.

In certain embodiments, repetitive activations of the switch 146 provide different instructions to the microcontroller 142. In this way in certain embodiments, a single activation provides a first instruction and two repetitive activations provide a second instruction. In certain embodiments, a visual and or audible acknowledgement for receipt of the control signal is provided by the alternative control module 128. In certain embodiments, the alternative control module 128 comprises one or more visual indicators and/or audible indicators.

In certain embodiments, the user need not directly contact the switch 146. In the illustrated embodiment, the cover 136 comprises a button 150 positioned over the switch 146. In certain embodiments, the user presses an outer surface of the button 150 to activate the switch 146. In the illustrated embodiment, the cover 136 comprises one or more slits defining in part the button 150. Of course the cover 136 need not comprise slits to define the button 150. To minimize dirt and other foreign contaminants from entering the slits around the button 150, certain embodiments comprise a shield 152. In certain embodiments, the shield 152 comprises a flexible material that allows the user to press both the shield 152 and the button 150 at the same time. In certain embodiments, at least a portion of the shield 152 is transparent. The transparent portion may allow the user to observe the visual indicator acknowledging receipt of the user's control signal entered via the button 150.

Figure 16:
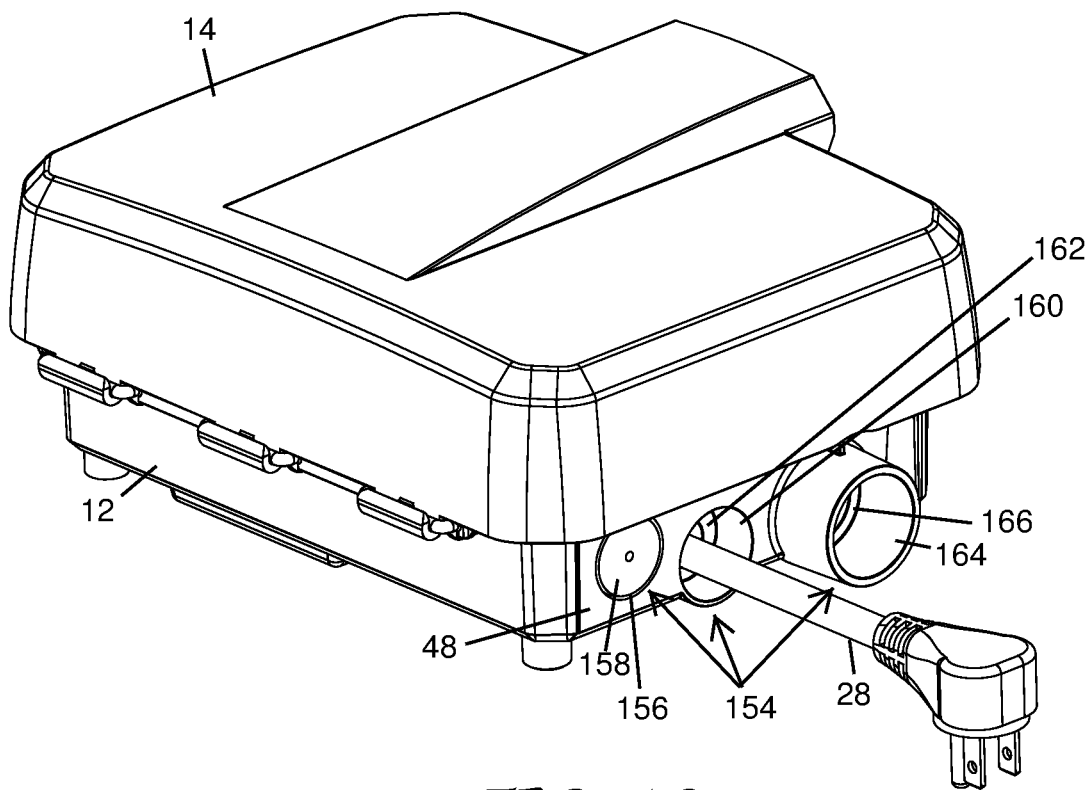
FIG. 16 is a front, left, bottom perspective view showing the base portion comprising one or more openings for connections to the control box. The power cord is shown extending through the one or more openings.
Figure 17:
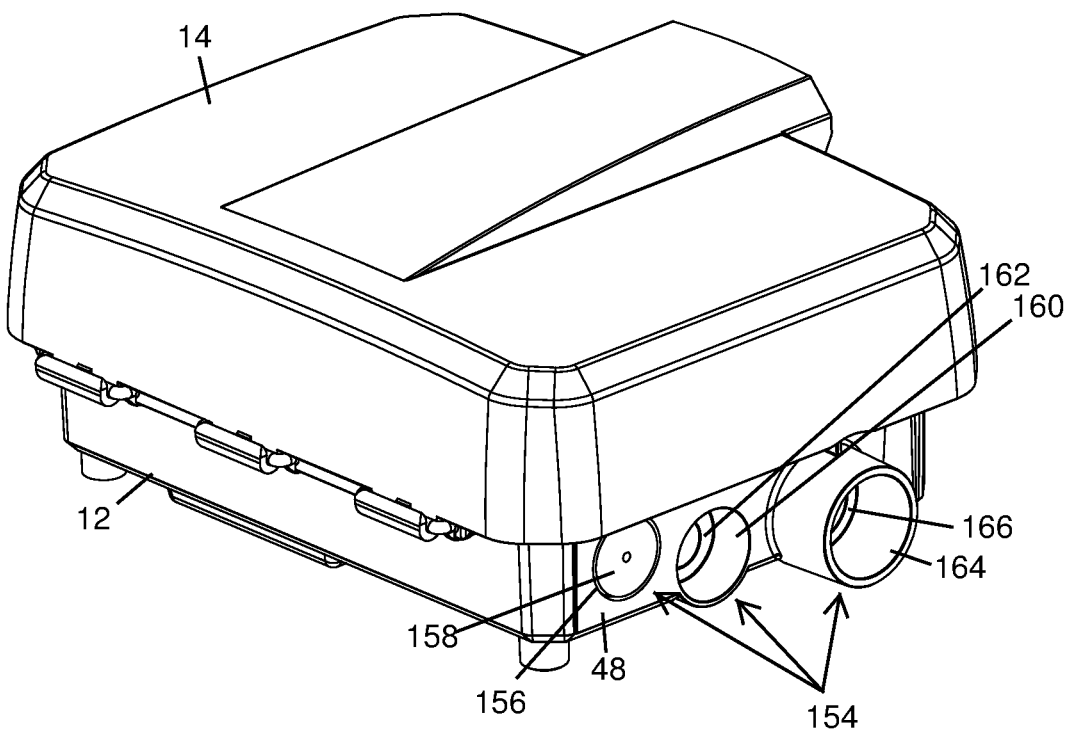
FIG. 17 is similar to FIG. 16 except the control box is configured to be hardwired to the power grid as an alternative to employing the power cord in FIG. 16.
Figure 18:
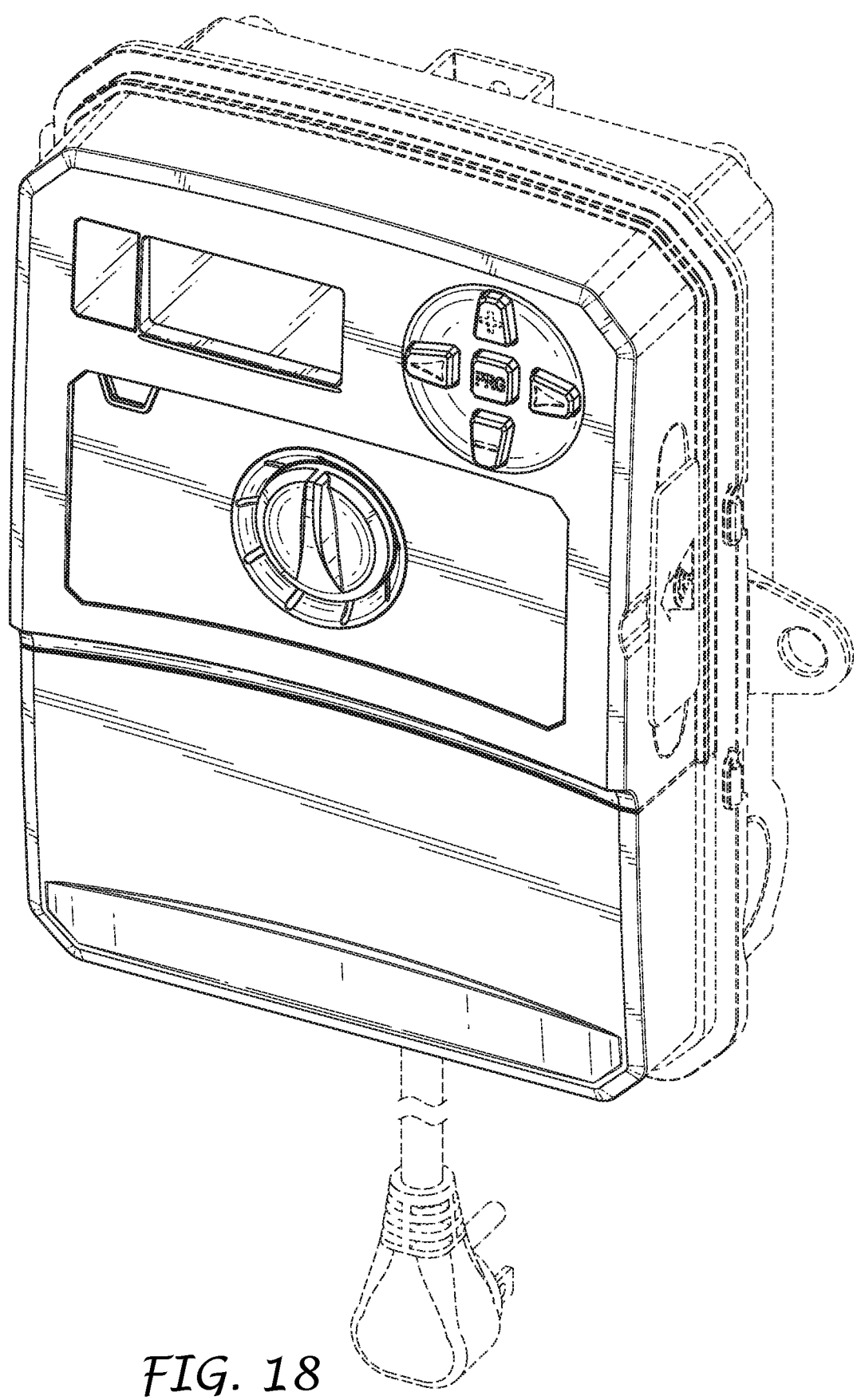
FIG. 18 is a front, right, top perspective view of an embodiment of a base portion.
Figure 19:
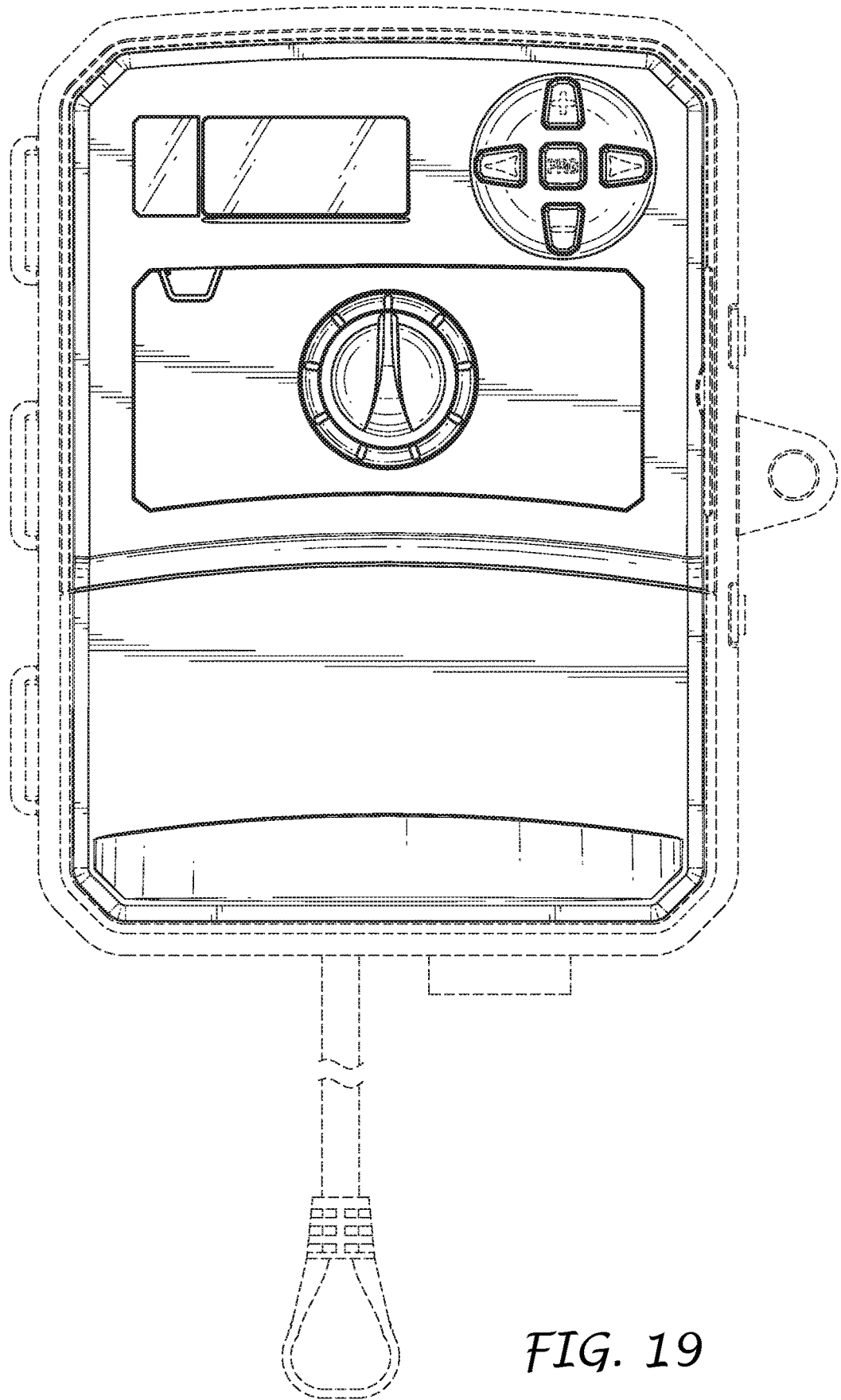
FIG. 19 is a front plan view of the base portion of FIG. 18.
Figure 20:
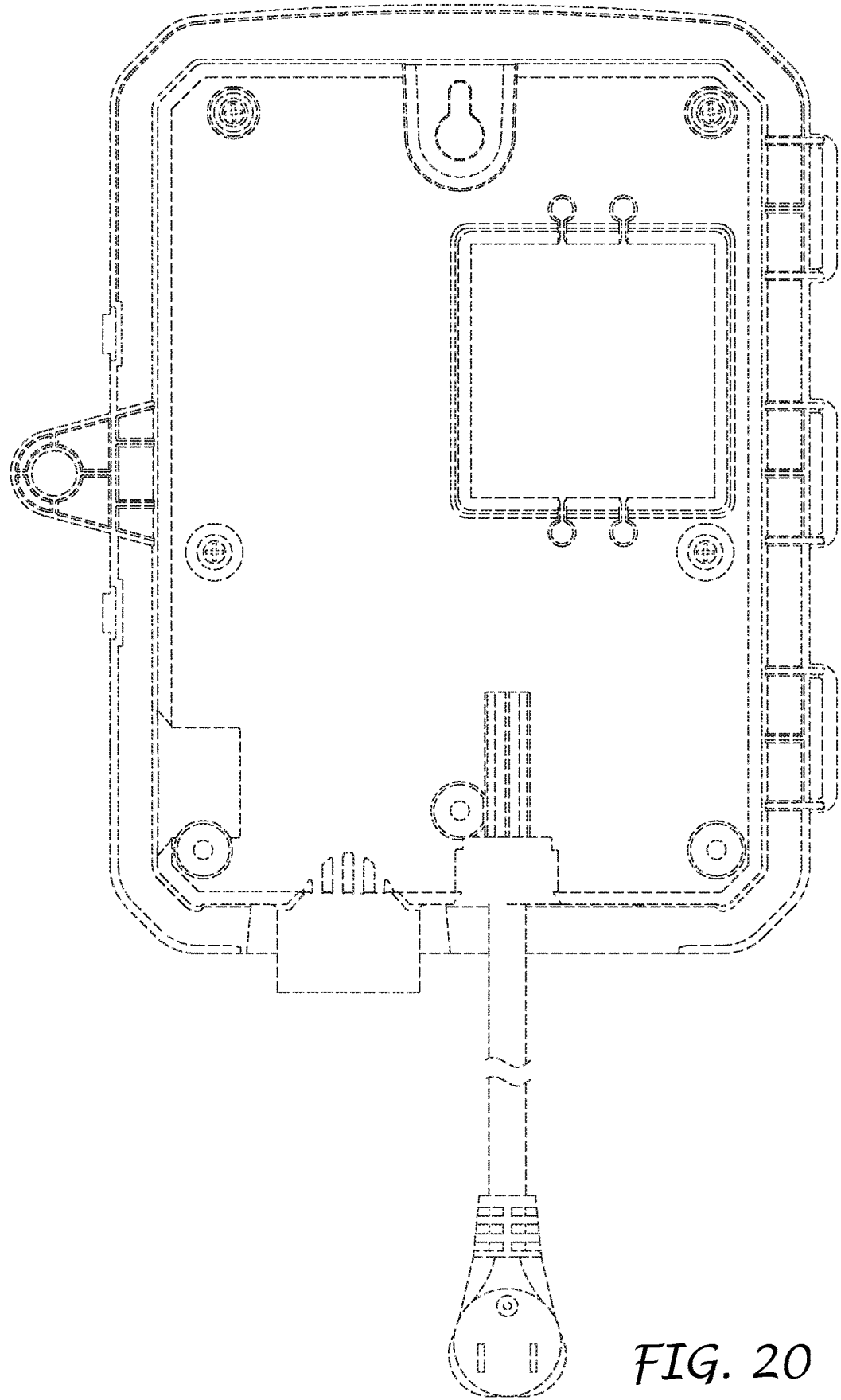
FIG. 20 is a back plan view of the base portion of FIG. 18.
Figure 21:
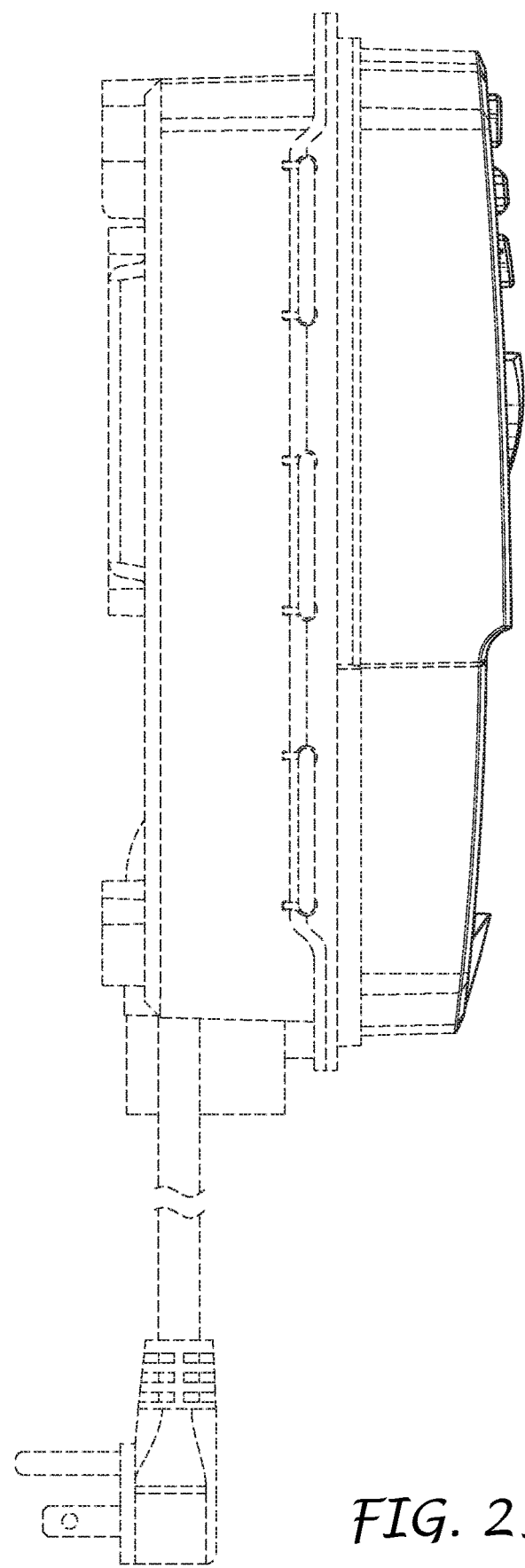
FIG. 21 is a left-side plan view of the base portion of FIG. 18.
Figure 22:
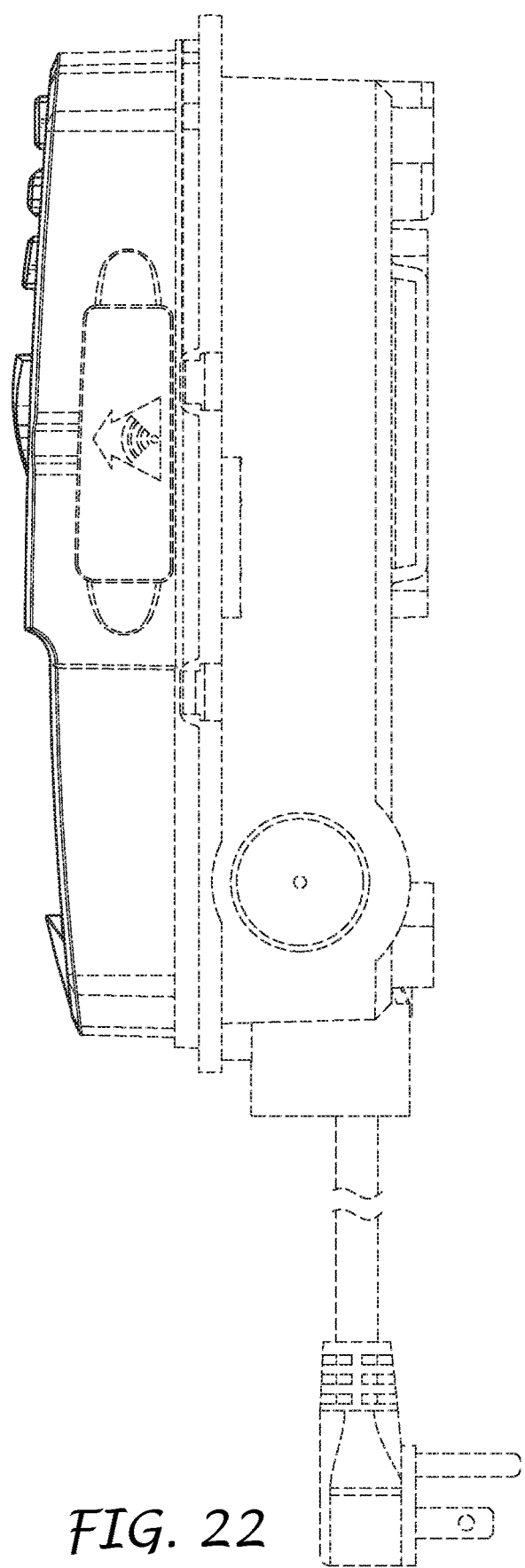
FIG. 22 is a right-side plan view of the base portion of FIG. 18.
Figure 23:
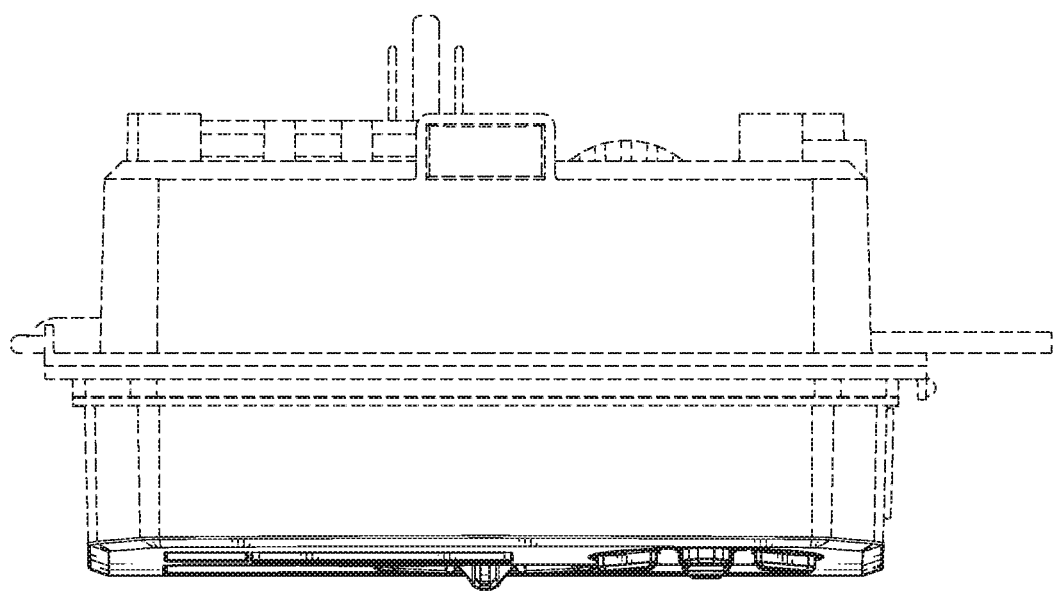
FIG. 23 is a top plan view of the base portion of FIG. 18.
Figure 24:
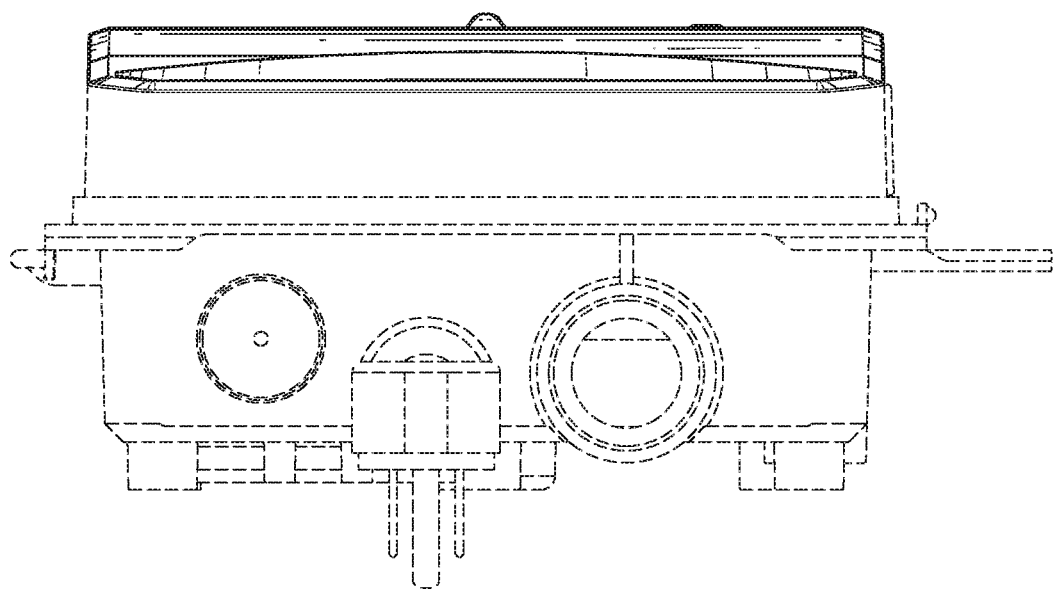
FIG. 24 is a bottom plan view of the base portion of FIG. 18.

Returning to FIG. 3, and also considering FIGS. 16 and 17, it is seen that the second wall 48 (e.g., the bottom wall) of the base portion 12 defines one or more openings 154. FIG. 16 is a front, left, bottom perspective view showing the base portion 12 comprising the one or more openings 154 for connections to the control box 10. The power cord 28 is shown extending through the one or more openings 154. FIG. 17 is similar to FIG. 16 except the control box 10 is configured to be hardwired to the power grid as an alternative to employing the power cord 28 in FIG. 16.

In certain embodiments, the one or more openings 154 are disposed in the second wall 48 of the base portion 12. In certain embodiments, an amount of overlap of the base portion 12 by the outer cover 14 provides both unobstructed access to the one or more openings 154 and a barrier to dirt and other foreign contaminants from entering the control box 10. In certain embodiments, a relief or cut-out is provided in the outer cover 14 that aligns with the one or more openings 154 when the outer cover 14 is in the closed position. In certain embodiments, the relief or cut-out provided in the outer cover 14 aligns with the one or more openings 154 when the outer cover 14 is in the closed position. In the illustrated embodiment, the outer cover 14 comprises a cut-out in the proximity of an extended fitting 164. In certain embodiments, the relief or cut-out in the outer cover 14 may increase a size of the partially covered second wall 48 for connecting to a pipe or conduit.

In certain embodiments, the one or more openings 154 are disposed in other walls of the base portion 12 or in more than one wall of the base portion 12. For example, in certain embodiments, the one or more openings 154 can be disposed in either, or both, the first wall 46 and the third wall 50. Other walls and combinations of walls of the base portion 12 are also within the scope of this disclosure.

In certain embodiments, specific openings within the one or more openings 154 are sized and/or located in the base portion 12 for specific cords, cables, and/or wires. Cords, cables, and wires can be employed for transmission of power, station signals, sensor information data, and/or weather information data. In certain embodiments, the power cord 28, the cables, and/or wires each pass through different openings of the one or more openings 154. For example, in certain embodiments, power is provided to the control box 10 via a first opening, station signals are provided via cables and/or wires through a second opening, and sensor information signals are provided via cables and/or wires through a third opening. Such an arrangement may mitigate electrical interference between cables and wires that conduct signals from power cords.

In certain embodiments, the one or more openings 154 are sized and shaped to facilitate, for example, the power cord 28 and/or one or more cables or wires passing through the base portion 12. In certain embodiments, the one or more openings 154 are sized and shaped to facilitate, for example, attachment of different sizes of pipes and conduits to the base portion 12. For example, the one or more openings 154 can be sized and shaped to connect to a plurality of pipes or conduits having different sizes or geometry. In this way, the user or technician has options for connecting different pipes or conduits to the same control box 10. In certain embodiment, the one or more openings 154 comprises at least two different sized/shaped openings. In certain embodiments, the one or more openings 154 are configured to connect to one or more ½ inch, ¾ inch, 1 inch, and/or 1¼ inch pipes or conduits. In certain embodiments, the pipes or conduits have a thickness of schedule 40.

In certain embodiments, the one or more openings 154 are aligned with the power cord 28 and/or the one or more terminals 68 of the housing 76 to simplify cable management through the base portion 12 and out of the control box 10.

Certain embodiments of the control box 10 can be designed for use with metal (i.e., conductive) pipes and conduits (brass or aluminum, for example), while other embodiments are designed for use with nonconductive polyvinylchloride (PVC) pipes or conduits. Certain embodiments of the control box 10 may be designed to satisfy local requirements as to conduit size or materials.

In certain embodiments, an opening 156 of the one or more openings 154 is configured to engage with a conduit adapter provided by the user or technician. In certain embodiments, the opening 156 is sized to accommodate the conduit adapter and/or one or more bushings, locknuts, and/or spacers. In certain embodiments, the opening 156 provides the user or technician with a connection for attaching a size or type of pipe or conduit that is not provided by the control box 10. For example, in certain embodiments, the opening 156 comprises internal threads to engage with the external threads on the conduit adapter. In certain embodiments, the opening 156 comprises an internal wall configured to provide a slip or glue fit with the conduit adapter. In certain embodiments, the opening 156 is sized and shaped to engage with a conduit adapter that is a reducer or adapter to a desired size pipe or conduit.

In certain embodiments, one or more of the one or more openings 154 comprises a knockout 158 covering the one or more openings 154. In the illustrated embodiment, the opening 156 comprises the knockout 158. The user or technician may leave the knockout 158 in place covering the opening 156 or remove the knockout 158 to utilize the opening 158.

In certain embodiments, the one or more openings 154 comprise one or more recessed bores 160 and/or one or more extended bores/bosses 164. For example, in certain embodiments, the one or more openings 154 are configured as the recessed bore 160 to receive an end of the pipe or conduit within the second wall 48. In certain embodiments where the one or more openings 154 are configured as the recessed bore 160, the one or more openings 154 include a tubular passage, which defines a substantially straight bore portion into the second wall 48 leading to a circumferential detent 162. The detent 162 defines a shoulder for the bore portion. The shoulder limits the maximum insertion depth for the end of the pipe or conduit into the second wall 48.

In certain embodiments, the one or more openings 154 are configured as the extended bore 164 to receive an end of the pipe or conduit. When connecting to the extended bore 164 in certain embodiments, the end of the pipe or conduit need not pass through the second wall 48 and instead merely abuts the second wall 48. For example in certain embodiments, the end of the pipe or conduit can be secured solely within the extended bore 164. In this way, the extended bore 164 provides adequate stability to the connected pipe or conduit. By including an extended bore 164, the second wall 48 can accommodate pipes and conduits that have a greater range of diameters than with only recessed bores 160. In certain embodiments, the extended bore 164 allows the user or technician to attach a pipe or conduit that has a diameter that exceeds a width of the second wall 48. For example, an extended bore 164 can provide the control box 10 with an opening that has a greater diameter than offered by the recessed bore 160. In certain embodiments, the extended bore 164 allows the control box 10 to maintain a low profile while also accommodating connections to pipes and conduits that are too large for connecting to the recessed bore 160.

In certain embodiments that have an extended bore 164, the one or more openings 154 include a tubular body, which at an upper end defines a substantially straight inner bore portion leading to a circumferential detent 166. The detent 166 defines a shoulder for the bore portion when the one or more openings 154 are configured as an extended bore 164.

In certain embodiments that have an extended boss 164, the one or more openings 154 include a tubular body, which at an upper end defines an outer circumference for receiving the end of the pipe or conduit. In certain embodiments, the pipe or conduit is slid along the outer circumference until the end of the pipe or conduit abuts the second wall 48. In certain embodiments, a fin or projection on the outer circumference prevents the end of the pipe or conduit from abutting the second wall 48.

In certain embodiments, the end of the pipe or conduit is secured by one or both of the second wall 48 and/or the extended bore/boss 164. In certain embodiment, the one or more openings 154 are configured for a threaded fit, a slip fit, an adhesive fit, or any other engagement structure known by a person having ordinary skill in the art for connecting the one or more openings 154 to a pipe or conduit.

FIGS. 18-24 illustrate an embodiment of the base portion and facepack. Various attributes of the base portion and the facepack are shown in broken lines to illustrate that they may or may not be present and that their position, orientation, shape, style, number, etc. can be different according to the different embodiments. The broken lines form no part of the design. For example, FIGS. 18-24 show the base portion and facepack with all or most of the side walls and back side in broken lines. The side walls and back side are shown in broken lines to indicate that the side walls and back side can comprise various components, shapes, thicknesses, cavities, protrusions, according to different embodiments. Thus, the features illustrated in broken lines may or may not be present and the position, orientation, depth, shape, etc. of those features may differ according to different embodiments. Dot-dot-dash lines are used to illustrate boundary lines and also form no part of the claimed designs.

For expository purposes, the term "horizontal" as used herein is defined as a plane parallel to the plane or surface of the floor of the area in which the system being described is used or the method being described is performed, regardless of its orientation. The term "floor" can be interchanged with the term "ground." The term "vertical" refers to a direction perpendicular to the horizontal as just defined. Terms such as "above," "below," "bottom," "top," "side," "higher," "lower," "upper," "over," and "under," are defined with respect to the horizontal plane.

As used herein, the terms "attached," "connected," "mated," and other such relational terms should be construed, unless otherwise noted, to include removable, moveable, fixed, adjustable, and/or releasable connections or attachments. The connections/attachments can include direct connections and/or connections having intermediate structure between the two components discussed.

The terms "approximately", "about", "generally" and "substantially" as used herein represent an amount close to the stated amount that still performs a desired function or achieves a desired result. For example, the terms "approximately", "about", "generally," and "substantially" may refer to an amount that is within less than 10% of the stated amount.

While the preferred embodiments of the present inventions have been described above, it should be understood that they have been presented by way of example only, and not of limitation. It will be apparent to persons skilled in the relevant art that various changes in form and detail can be made therein without departing from the spirit and scope of the inventions. Thus, the present inventions should not be limited by the above-described exemplary embodiments, but should be defined only in accordance with the following claims and their equivalents. Furthermore, while certain advantages of the inventions have been described herein, it is to be understood that not necessarily all such advantages may be achieved in accordance with any particular embodiment of the inventions. Thus, for example, those skilled in the art will recognize that the inventions may be embodied or carried out in a manner that achieves or optimizes one advantage or group of advantages as taught herein without necessarily achieving other advantages as may be taught or suggested herein.

What is claimed is:

1. A landscape control box comprising:
   a base portion having a plurality of side walls and a back wall forming an interior; and
   a facepack supported by the base portion, the facepack comprising:
   a printed circuit board supporting a rotary shaft extending along an axis in a first direction;
   a cover supporting the printed circuit board so that the printed circuit board is disposed between the cover and the base portion at least when the facepack is supported by the base portion, the cover having an abutment surface and a hole, the hole being aligned with the rotary shaft and having a lip; and
   a knob disposed at least partially in the hole, the knob having a receptacle, one or more posts, and a contact surface, the receptacle engaging with the rotary shaft so as to transfer rotational motion of the knob to the rotary shaft while allowing the knob to slide along the axis in both the first direction and in a second direction opposite to the first direction to prevent tension between the knob and the rotary shaft due to temperature changes and other environmental factors, the one or more posts having a shank and a protrusion, the shank not engaging with the hole, the protrusion being sized and shaped to engage with the lip so as to inhibit movement of the knob in the first direction away from the cover, the contact surface abutting the abutment surface of the cover when the knob is pressed against the cover.

2. The landscape control box of claim 1, further comprising an outer cover, the outer cover being configured to move between an open position and a closed position, at least a portion of the facepack being disposed between the base portion and the outer cover at least when the outer cover is in the closed position.

3. The landscape control box of claim 1, further comprising a power supply, the power supply being sized and shaped to be at least partially disposed in the interior.

4. The landscape control box of claim 1, wherein the printed circuit board comprises one or more terminals, and wherein the facepack comprises a terminal cover, the terminal cover being disposed so as to prevent a user from accessing the one or more terminals when in a first position and allow the user to access the one or more terminals when in a second position.

5. The landscape control box of claim 1, wherein the abutment surface has an annular shape, and wherein the abutment surface faces the contact surface of the knob.

6. The landscape control box of claim 1, further comprising a rotary selection switch supported by the printed circuit board, the rotary selection switch being coupled to the rotary shaft.

7. The landscape control box of claim 1, wherein the facepack further comprises a screen.

8. The landscape control box of claim 1, wherein the facepack further comprises one or more buttons.

9. The landscape control box of claim 1, wherein the facepack further comprises a slot sized and shaped to guide at least a portion of a module to pass therethrough and electrically connect with the printed circuit board while the facepack is supported by the base portion.

10. The landscape control box of claim 9, further comprising a removable door disposed over the slot.

11. The landscape control box of claim 1, wherein the shank comprises a distal portion, and wherein the distal portion has a tapering shape.

12. The landscape control box of claim 1, wherein the cover further comprises a first annular wall and a second annular wall, the first annular wall and the second annular wall surrounding at least a portion of the hole so as to prevent water from entering the interior of the base portion.

13. The landscape control box of claim 12, wherein the abutment surface is disposed between the first annular wall and the second annular wall.

14. A landscape control box comprising:
a base portion having a plurality of side walls and a back wall forming an interior; and
a facepack supported by the base portion, the facepack comprising:
a component supporting a rotary shaft extending along an axis in a first direction;
a cover supporting the component so that the component is disposed between the cover and the base portion at least when the facepack is supported by the base portion, the cover having an interacting structure and an abutment surface, the interacting structure of the cover comprising a hole, the hole being aligned with the rotary shaft and having a lip; and
a knob disposed on the cover, the knob having a receptacle, an interacting structure, and a contact surface, the receptacle being configured to operably couple to the rotary shaft so as to transfer rotational motion of the knob to the rotary shaft while allowing the knob to slide along the axis in both the first direction and in a second direction opposite to the first direction to prevent tension between the knob and the rotary shaft due to temperature changes and other environmental factors, the interacting structure of the knob comprising a shank and a protrusion, the shank not engaging with the hole, the protrusion being sized and shaped to engage with the lip of the cover so as to inhibit movement of the knob in the first direction away from the cover, the contact surface abutting the abutment surface of the cover when the knob is pressed against the cover.

15. The landscape control box of claim 14, wherein the abutment surface has an annular shape, and wherein the abutment surface faces the contact surface of the knob.

16. The landscape control box of claim 14, wherein the shank comprises a distal portion, and wherein the distal portion has a tapering shape.

17. The landscape control box of claim 14, wherein the cover further comprises a first annular wall and a second annular wall, the first annular wall and the second annular wall surrounding at least a portion of the hole so as to prevent water from entering the interior of the base portion.

18. The landscape control box of claim 17, wherein the abutment surface is disposed between the first annular wall and the second annular wall.

19. A landscape control box comprising:
a base portion having a plurality of side walls and a back wall forming an interior; and
a facepack supported by the base portion, the facepack comprising:
a rotary shaft extending along an axis in a first direction;
a cover supporting the rotary shaft so that at least a portion of the rotary shaft is disposed between the cover and the base portion at least when the facepack is supported by the base portion, the cover having a first interacting structure and an abutment surface, the interacting structure of the cover comprising a hole, the hole being aligned with the rotary shaft and having a lip; and
a knob disposed on the cover, the knob having a hub, a second interacting structure, and a contact surface, the hub being configured to operably couple to the rotary shaft so as to transfer rotational motion of the knob to the rotary shaft while allowing the knob to slide along the axis in both the first direction and in a second direction opposite to the first direction to prevent tension between the knob and the rotary shaft due to temperature changes and other environmental factors, the second interacting structure comprising a shank and a protrusion, the shank not engaging with the hole, the lip of the cover engaging with the protrusion so as to inhibit movement of the knob in the first direction away from the cover, the contact surface abutting the abutment surface of the cover when the knob is pressed against the cover.

20. The landscape control box of claim 19, wherein a level of friction between the knob and the rotary shaft allows the knob to slide at least slightly along the axis in both the first direction and the second direction while the first interacting structure and the second interacting structure inhibit removal of the knob from the rotary shaft.

* * * * *